(12) United States Patent
Komura et al.

(10) Patent No.: US 11,011,699 B2
(45) Date of Patent: May 18, 2021

(54) SEMICONDUCTOR STORAGE DEVICE

(71) Applicant: KIOXIA CORPORATION, Tokyo (JP)

(72) Inventors: Masanori Komura, Kuwana Mie (JP);
Takayuki Tsukamoto, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/807,770

(22) Filed: Mar. 3, 2020

(65) Prior Publication Data
US 2021/0083183 A1    Mar. 18, 2021

(30) Foreign Application Priority Data

Sep. 17, 2019   (JP) .............................. JP2019-168268

(51) Int. Cl.
*H01L 45/00*        (2006.01)
*H01L 27/24*        (2006.01)

(52) U.S. Cl.
CPC ............ *H01L 45/122* (2013.01); *H01L 27/24* (2013.01); *H01L 45/141* (2013.01); *H01L 45/16* (2013.01)

(58) Field of Classification Search
CPC ..... H01L 45/122; H01L 45/16; H01L 45/141; H01L 27/24
USPC ......... 257/2, 3, 4, 5, 379, 40, 544, E27.051, 257/E27.073, E27.081, E27.004, E21.003, 257/E21.004, E21.068, E21.662, E45.001, 257/E45.002; 365/148, 158, 163, 189.05, 365/189.07; 438/382, 384, 469, 585
See application file for complete search history.

(56) References Cited

U.S. PATENT DOCUMENTS

| | | | |
|---|---|---|---|
| 7,990,754 B2 | 8/2011 | Azuma | |
| 8,804,402 B2 | 8/2014 | Minemura | |
| 8,923,031 B2 | 12/2014 | Sakamoto | |
| 9,230,646 B2 | 1/2016 | Sonehara | |
| 2010/0091551 A1* | 4/2010 | Hosono | G11C 13/0004 365/148 |
| 2014/0293675 A1* | 10/2014 | Kanno | G11C 13/0035 365/148 |
| 2014/0334221 A1* | 11/2014 | Okawa | G11C 13/0002 365/148 |

(Continued)

FOREIGN PATENT DOCUMENTS

JP    2011-018838 A    1/2011

*Primary Examiner* — Dao H Nguyen
(74) *Attorney, Agent, or Firm* — Foley & Lardner LLP

(57) ABSTRACT

A semiconductor storage device includes first to third wirings extending in a first direction and adjacent in a second direction intersecting the first direction, fourth to sixth wirings extending in the second direction and adjacent in the first direction, memory cells each having one end connected to one of the first to third wirings and the other end connected to one of the fourth to sixth wirings, a circuit configured to output a first voltage, second and third voltages higher than the first voltage, a fourth voltage higher than the second voltage and the third voltage, and a fifth voltage higher than the fourth voltage. In a write operation for memory cells connected to the first and fourth wirings, the first, fourth, second, fifth and third voltages are transferred to the first, second, third, fourth, and fifth wirings, respectively, and the third voltage is transferred to the sixth wiring.

10 Claims, 30 Drawing Sheets

(56) References Cited

U.S. PATENT DOCUMENTS

| | | | |
|---|---|---|---|
| 2014/0355326 A1* | 12/2014 | Okawa | G11C 13/0002 365/63 |
| 2016/0163981 A1* | 6/2016 | Toriyama | G11C 13/0026 365/148 |
| 2020/0294583 A1* | 9/2020 | Miyazaki | G11C 13/003 |

* cited by examiner

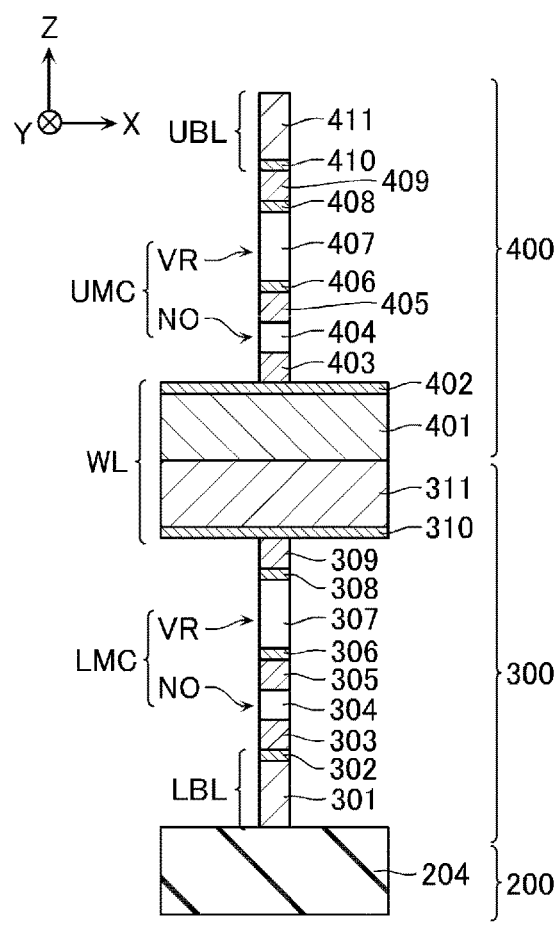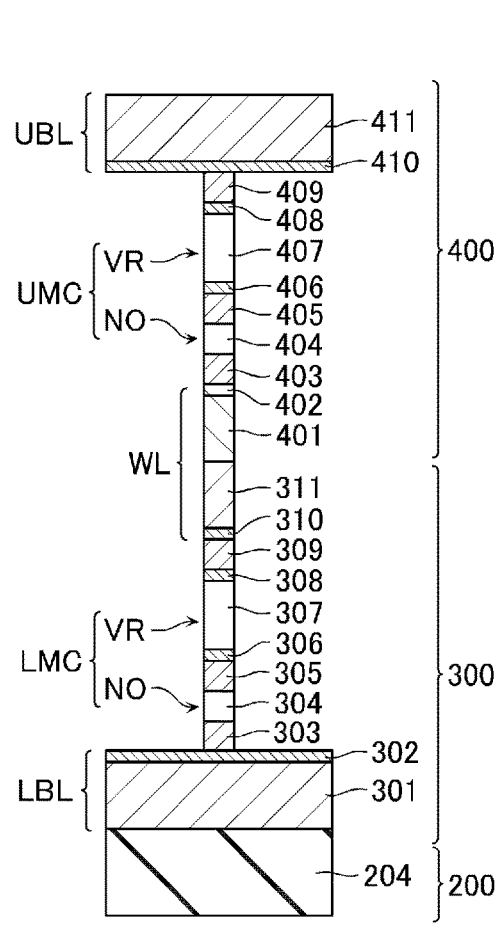

SEMICONDUCTOR STORAGE DEVICE

CROSS-REFERENCE TO RELATED APPLICATION(S)

This application claims the benefit of and priority to Japanese Patent Application No. 2019-168268, filed on Sep. 17, 2019, the entire contents of which are incorporated herein by reference.

FIELD

Embodiments described herein relate generally to a semiconductor storage device.

BACKGROUND

There is known a semiconductor storage device including a plurality of first wirings, a plurality of second wirings intersecting the plurality of first wirings, and a plurality of memory cells connected to wirings, each of the memory cells including a variable resistance layer and a nonlinear element layer including chalcogen.

DESCRIPTION OF THE DRAWINGS

FIGS. 7A and 7B are a schematic sectional view illustrating a partial configuration of the semiconductor storage device.

DETAILED DESCRIPTION

Figure 1:
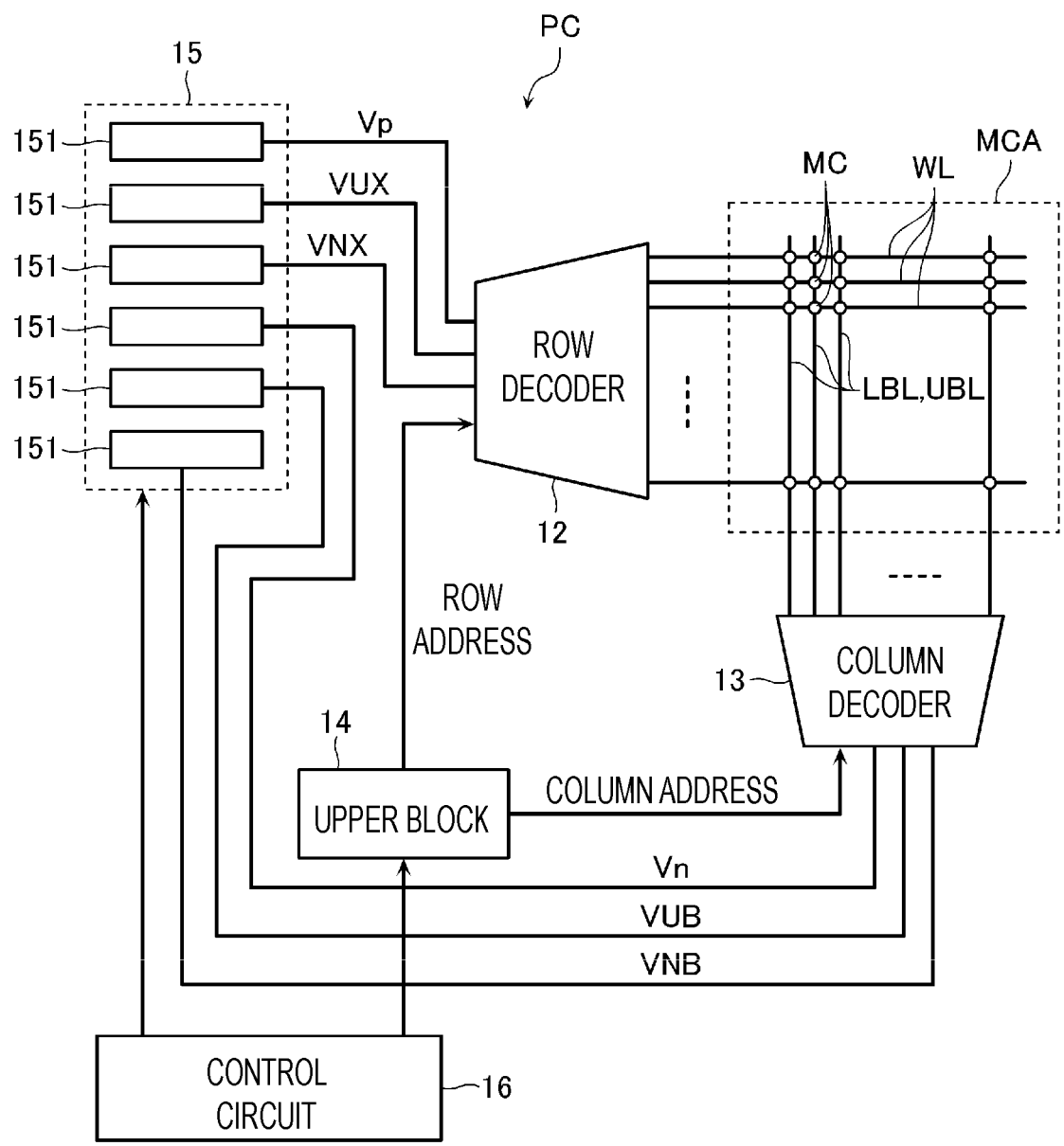
FIG. 1 is a schematic block diagram illustrating a partial configuration of a semiconductor storage device according to a first embodiment.

Embodiments provide a controllable semiconductor storage device.

In general, according to one embodiment, a semiconductor storage device may include a first wiring extending in a first direction, a second wiring extending in the first direction and adjacent to the first wiring in a second direction intersecting the first direction, a third wiring extending in the first direction and adjacent to the second wiring in the second direction, a fourth wiring extending in the second direction, a fifth wiring extending in the second direction and adjacent to the fourth wiring in the first direction, a sixth wiring extending in the second direction and adjacent to the fifth wiring in the first direction, a plurality of memory cells each having one end connected to one of the first to third wirings and the other end connected to one of the fourth to sixth wirings, each of the memory cells including a variable resistance film and a chalcogen film, a voltage output circuit configured to output a first voltage, a second voltage higher than the first voltage, a third voltage higher than the first voltage, a fourth voltage higher than the second voltage and the third voltage, and a fifth voltage higher than the fourth voltage, and a voltage transfer circuit connected to the first to sixth wirings and the voltage output circuit. At a predetermined timing of a write operation for memory cells connected to the first wiring and the fourth wiring, the first voltage may be transferred to the first wiring, the fourth voltage may be transferred to the second wiring, the second voltage may be transferred to the third wiring, the fifth voltage may be transferred to the fourth wiring, the third voltage may be transferred to the fifth wiring, and the third voltage may be transferred to the sixth wiring.

According to another embodiment, a semiconductor storage device may include a first wiring extending in a first direction, a second wiring extending in the first direction and adjacent to the first wiring in a second direction intersecting the first direction, a third wiring extending in the first direction and adjacent to the second wiring in the second direction, a fourth wiring extending in the second direction, a fifth wiring extending in the second direction and adjacent to the fourth wiring in the first direction, a sixth wiring extending in the second direction and adjacent to the fifth wiring in the first direction, a plurality of memory cells each having one end connected to one of the first to third wirings and the other end connected to one of the fourth to sixth wirings, each of the memory cells including a variable resistance film and a chalcogen film, a voltage output circuit configured to output a first voltage, a second voltage lower than the first voltage, a third voltage lower than the first voltage, a fourth voltage lower than the second voltage and the third voltage, and a fifth voltage lower than the fourth voltage, and a voltage transfer circuit connected to the first to sixth wirings and the voltage output circuit. At a predetermined timing of a write operation for memory cells connected to the first wiring and the fourth wiring, the first voltage may be transferred to the first wiring, the fourth voltage may be transferred to the second wiring, the second voltage may be transferred to the third wiring, the fifth voltage may be transferred to the fourth wiring, the third voltage may be transferred to the fifth wiring, and the third voltage may be transferred to the sixth wiring.

Next, a semiconductor storage device according to the embodiments will be described in detail with reference to the drawings. The following embodiments are merely examples, and are not intended to limit the present disclosure. Further, the following drawings are schematic, and certain components may be omitted for convenience of explanation.

In the present disclosure, a predetermined direction parallel to the surface of a substrate is called an X direction, a direction parallel to the surface of the substrate and perpendicular to the X direction is called a Y direction, and a direction perpendicular to the surface of the substrate is called a Z direction.

In addition, in the present disclosure, a direction along a predetermined surface may be called a first direction, a direction intersecting the first direction along the predetermined surface may be called a second direction, and a direction intersecting the predetermined surface may be called a third direction. The first direction, second direction and third direction may or may not correspond to any of the X direction, the Y direction and the Z direction.

In the present disclosure, expressions such as "upper" and "lower" are based on a substrate. For example, when the first direction intersects the surface of the substrate, the direction away from the substrate along the first direction is referred to as "upper", and the direction approaching the substrate along the first direction is referred to as "lower". In addition, when referring to a lower surface or a lower end for a certain configuration, it means the surface or end on the substrate side of the configuration. When referring to an upper surface or an upper end, it means the surface or end opposite to the substrate of the configuration. Further, a surface intersecting the second direction or the third direction is referred to as a side surface.

In addition, in the present disclosure, when the first configuration is "electrically connected" to the second configuration, the first configuration may be directly connected to the second configuration, or the first configuration may be connected to the second configuration via a wiring, a semiconductor member, a transistor or the like. For example, when three transistors are connected in series, the first transistor is "electrically connected" to the third transistor even when the second transistor is in an OFF state.

In addition, in the present disclosure, when the first configuration is "electrically isolated" from the second configuration, for example, it means a state in which an insulating film or the like is formed between the first configuration and the second configuration and a contact, a wiring or the like that connects the first configuration and the second configuration is not formed between the first configuration and the second configuration.

Further, in the present disclosure, when a circuit or the like makes an "electrical conduction" between two wirings or the like, it may mean, for example, that the circuit or the like includes a transistor or the like and the transistor or the like is provided on a current path between the two wirings and is in an ON state.

First Embodiment

[Entire Configuration]

Figure 2:
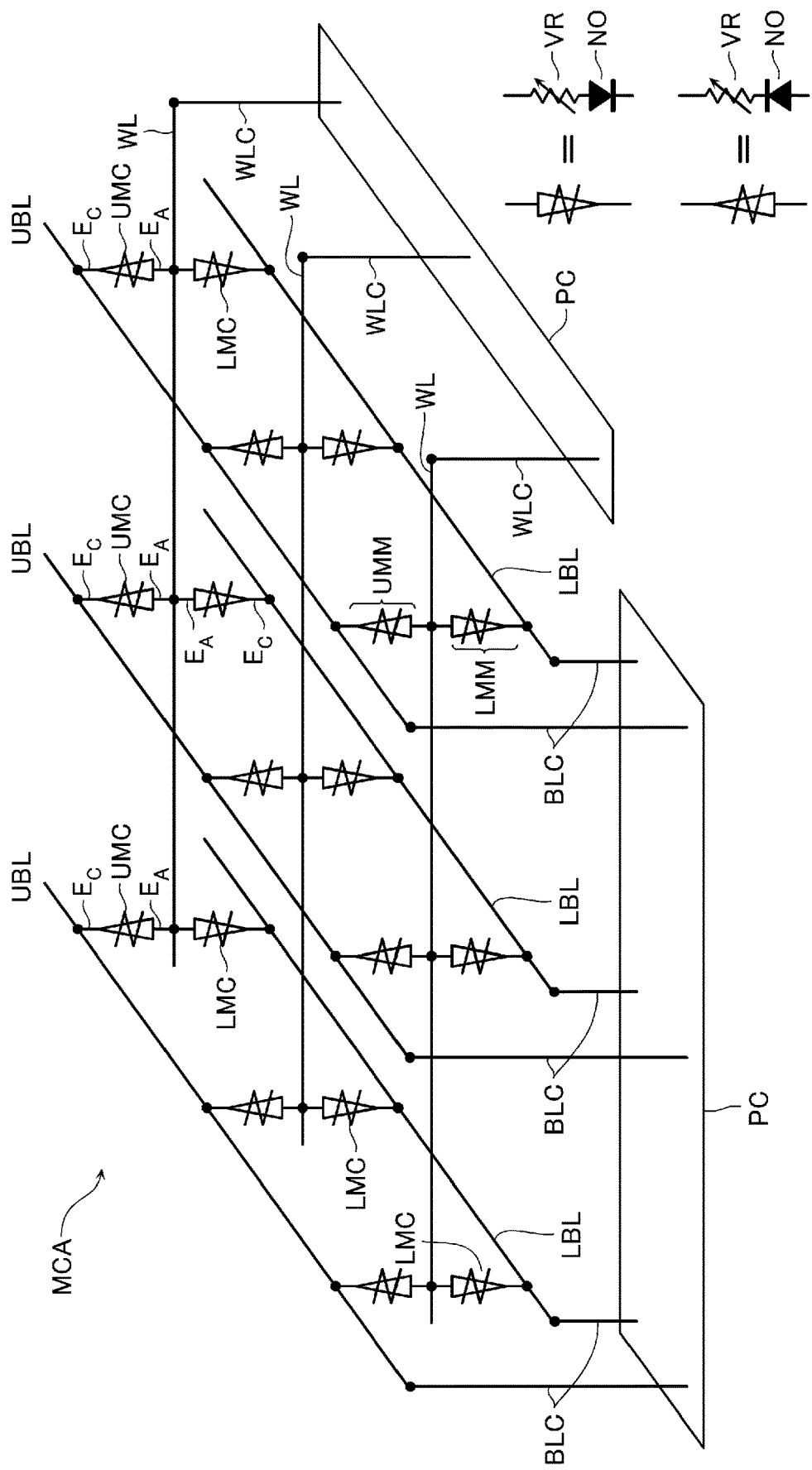
FIG. 2 is a schematic circuit diagram illustrating a partial configuration of the semiconductor storage device.
Figure 3:
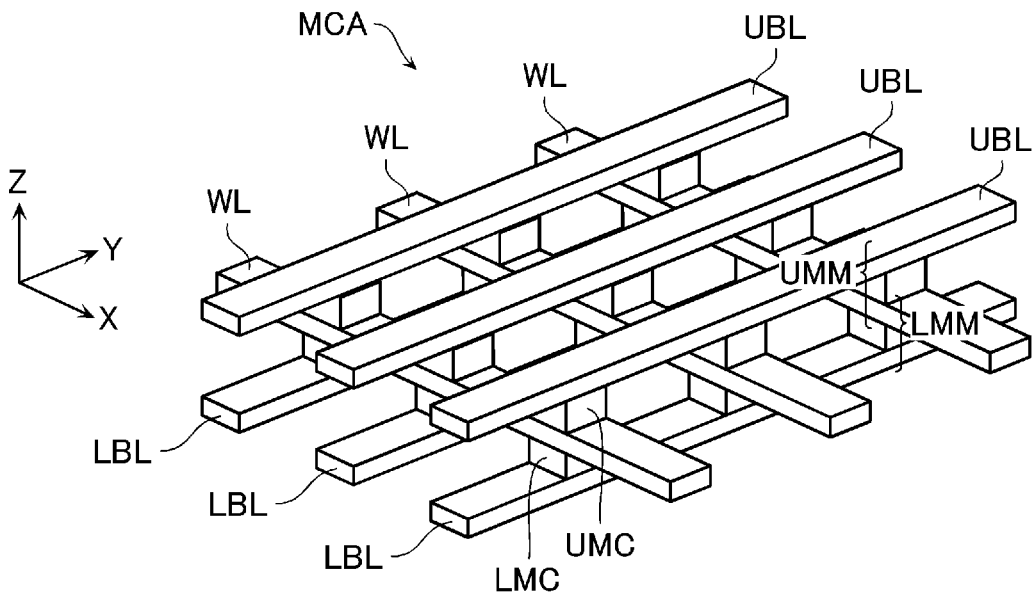
FIG. 3 is a schematic perspective view illustrating a partial configuration of the semiconductor storage device.

First, a semiconductor storage device according to a first embodiment will be briefly described with reference to FIG. 1, FIG. 2 and FIG. 3. FIG. 1 is a schematic block diagram illustrating a partial configuration of the semiconductor storage device. FIG. 2 is a schematic circuit diagram illustrating a partial configuration of the semiconductor device. FIG. 3 is a schematic perspective view illustrating a partial configuration of the semiconductor storage device.

As illustrated in FIG. 1, the semiconductor storage device according to the present embodiment includes a memory cell array MCA and a peripheral circuit PC that controls the memory cell array MCA.

The memory cell array MCA includes, for example, a lower layer memory mat LMM and an upper layer memory mat UMM which are arranged in the Z direction, as illustrated in FIG. 3.

The lower layer memory mat LMM includes a plurality of lower layer bit lines LBL arranged in the X direction and extending in the Y direction, a plurality of word lines WL arranged in the Y direction and extending in the X direction, and a plurality of memory cells LMC arranged in the X direction and the Y direction corresponding to the lower layer bit lines LBL and the word lines WL.

The upper layer memory mat UMM includes a plurality of upper layer bit lines UBL arranged in the X direction and extending in the Y direction, a plurality of word lines WL arranged in the Y direction and extending in the X direction, and a plurality of memory cells UMC arranged in the X direction and the Y direction corresponding to the upper layer bit lines UBL and the word lines WL.

In the example illustrated in FIG. 3, the lower layer memory mat LMM and the upper layer memory mat UMM share the word lines WL. In the following description, the lower layer bit lines LBL and the upper layer bit lines UBL may be simply referred to as "bit lines LBL and UBL" or the like.

In the example of FIG. 2, the cathodes $E_C$ of the memory cells LMC are connected to the lower layer bit lines LBL. The cathodes $E_C$ of the memory cells UMC are connected to the upper layer bit lines UBL. The anodes $E_A$ of the memory cells LMC and UMC are connected to the word lines WL.

The memory cells LMC and UMC each includes a variable resistance element VR and a nonlinear element NO.

As illustrated in FIG. 1, the peripheral circuit PC includes, for example, a row decoder 12 (voltage transfer circuit) connected to the word lines WL, a column decoder (voltage transfer circuit) 13 connected to the bit lines LBL and UBL, and an upper block decoder 14 that supplies a row address and a column address to the row decoder 12 and the column decoder 13, respectively. The peripheral circuit PC further includes a power supply circuit (voltage output circuit) 15 that outputs voltages to be supplied to the bit lines LBL and UBL and the word lines WL, and a control circuit 16 that controls the upper block decoder 14 and the power supply circuit 15.

The row decoder 12 may include, for example, a plurality of transfer transistors connected between the plurality of word lines WL and a plurality of voltage supply lines, and a decode circuit connected to the gate electrodes of the plurality of transfer transistors. The row decoder 12 may transfer a high voltage side voltage Vp to a selected word line WL, and transfer a voltage VUX or a voltage VNX to a nonselected word line WL.

The column decoder 13 may include, for example, a plurality of transfer transistors connected between the plurality of bit lines LBL and UBL and the plurality of voltage supply lines, and a decode circuit connected to the gate electrodes of the plurality of transfer transistors. The column decoder 13 may transfer a low voltage side voltage Vn to selected bit lines LBL and UBL, and transfer a voltage VUB or a voltage VNB to the nonselected bit lines LBL and UBL.

The power supply circuit 15 may supply the voltage Vp to the selected word line WL via the row decoder 12, and supply the voltage VUX or the voltage VNX to an adjacent word line WL and the nonselected word line WL. In addition, the power supply circuit 15 may supply the low voltage side voltage Vn to the selected bit lines LBL and UBL via the column decoder 13, and supply the voltage VUB or the voltage VNB to adjacent bit lines LBL and UBL and the nonselected bit lines LBL and UBL. The power supply circuit 15 includes, for example, a plurality of bias circuits 151 corresponding to a plurality of voltage supply lines that output these voltages. The bias circuit 151 may include, for example, a step-down circuit such as a regulator, and adjust an output voltage by appropriately stepping down a power supply voltage in accordance with a control signal from the control circuit 16.

[Configuration of Memory Cell Array]

Next, the configuration of the semiconductor storage device according to the present embodiment will be described in more detail with reference to FIGS. 4 to 9.

Figure 4:
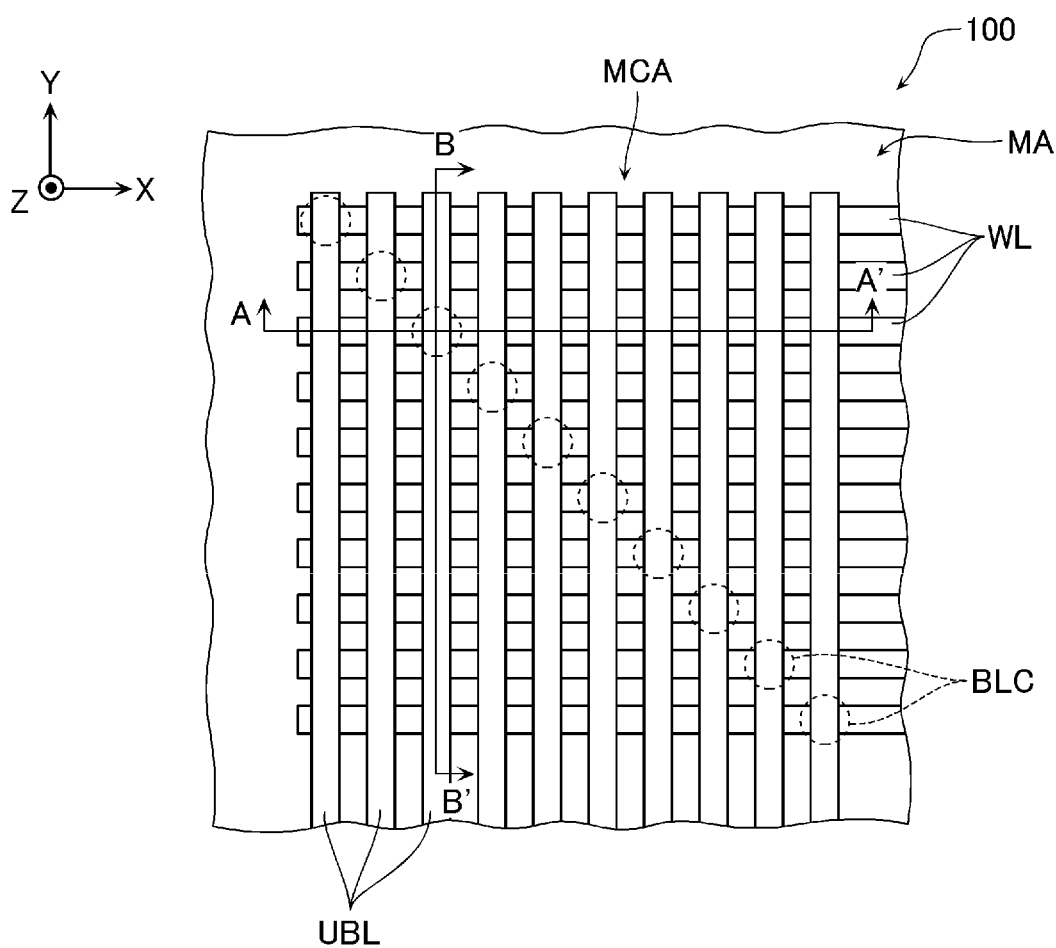
FIG. 4 is a schematic plan view illustrating a partial configuration of the semiconductor storage device.

FIG. 4 is a schematic plan view illustrating a partial configuration of the semiconductor storage device according to the present embodiment. The semiconductor storage device according to this embodiment includes a substrate 100. A memory area MA and a peripheral area (not illustrated) are formed in the substrate 100. A memory cell array MCA is formed in the memory area MA. A plurality of memory cell arrays MCA may be arranged on the memory area MA in the form of a matrix in the X direction and the Y direction, but only one of the memory cell arrays MCA is illustrated in FIG. 4. The peripheral circuit PC (see FIG. 2) may be formed in the peripheral area.

As illustrated in FIG. 4, bit line contacts BLC connected to the lower layer bit line LBL are formed in an area where the memory cell array MCA is formed (see FIG. 2). Word line contacts WLC (see FIG. 2) connected to the word lines WL may be formed in another area, e.g., an area other than the area where the memory cell array MCA is formed (see FIG. 2). Bit line contacts BLC connected to the upper layer bit lines UBL may be formed in other area, e.g., an area other than the area where the memory cell array MCA is formed (see FIG. 2).

Figure 5:
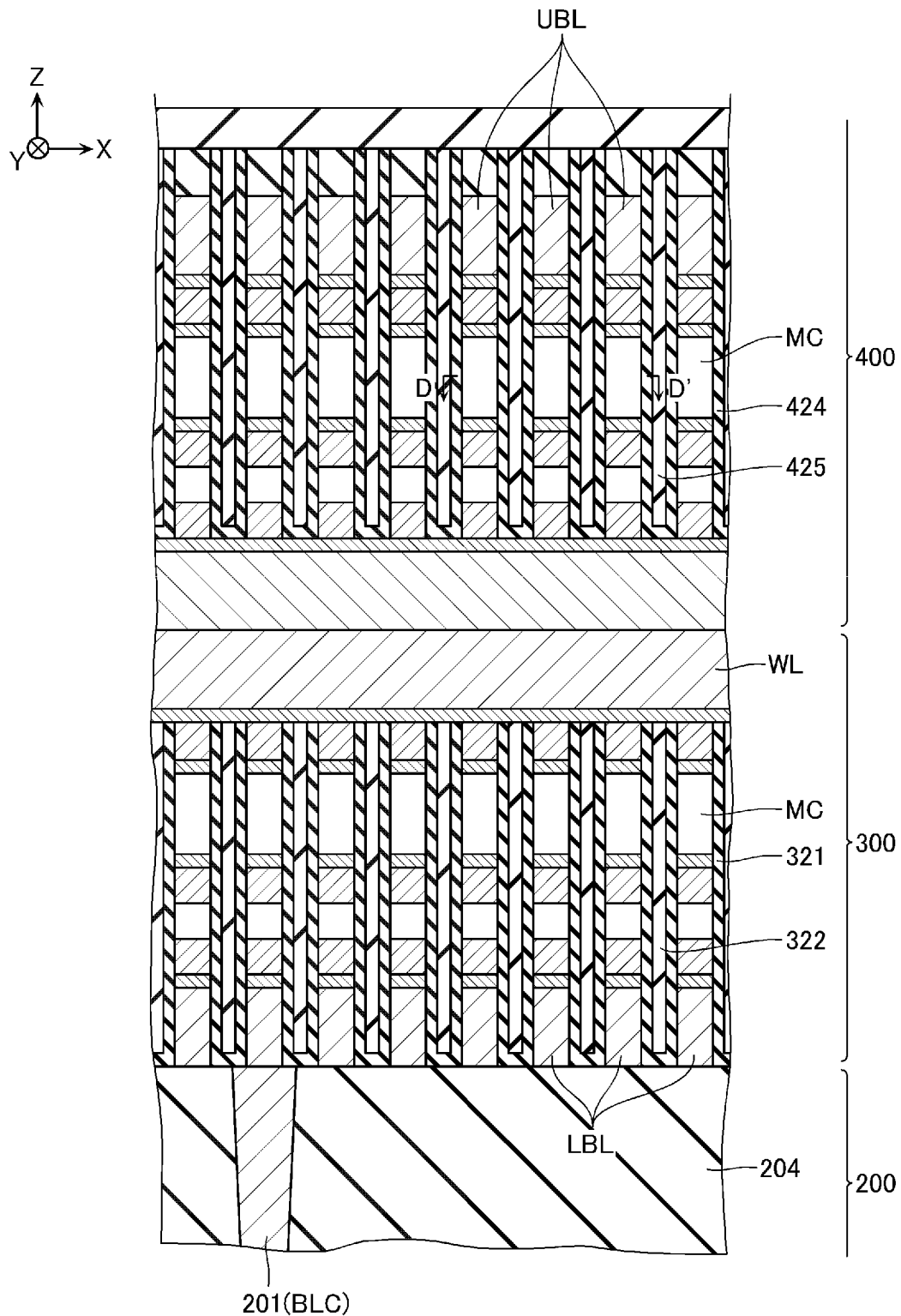
FIG. 5 is a schematic sectional view illustrating a partial configuration of the semiconductor storage device.
Figure 6:
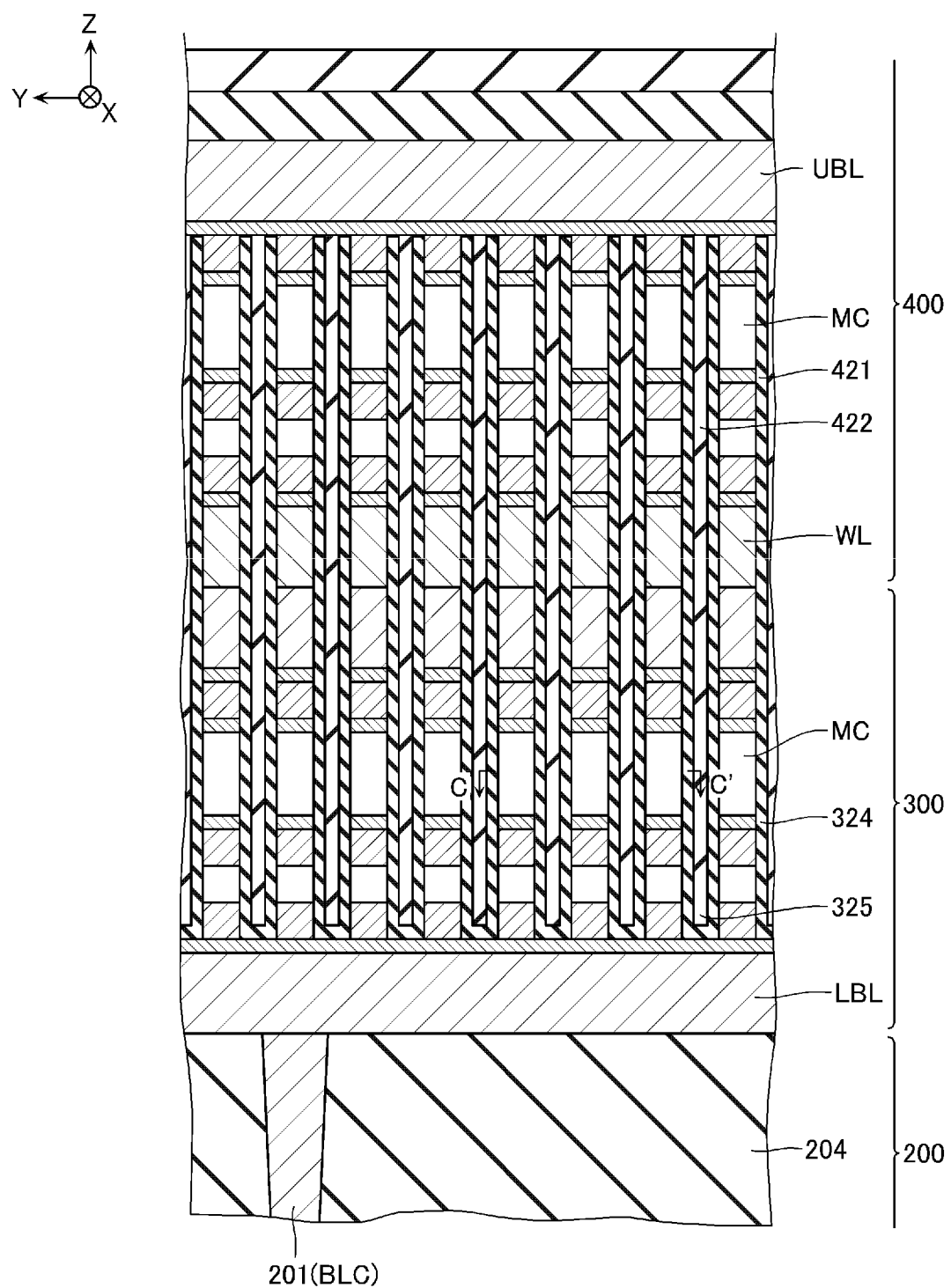
FIG. 6 is a schematic sectional view illustrating a partial configuration of the semiconductor storage device.

FIG. 5 is a schematic sectional view of the structure illustrated in FIG. 4, which is taken along line A-A' and viewed in the direction of an arrow. FIG. 6 is a schematic sectional view of the structure illustrated in FIG. 4, which is taken along line B-B' and viewed in the direction of an arrow. FIGS. 7A and 7B are a schematic sectional view corresponding to a portion of FIGS. 5 and 6.

As illustrated in FIG. 5, the semiconductor storage device according to the present embodiment includes a wiring layer 200, a memory layer 300 formed on the wiring layer 200, and a memory layer 400 formed on the memory layer 300.

The wiring layer 200 includes a contact wiring 201 and an insulating layer 204.

The contact wiring 201 (FIG. 5) may extend in the Z direction and function as a bit line contact BLC connected to a lower layer bit line LBL. The contact wiring 201 may include, for example, a stacked film of titanium nitride (TiN) and tungsten (W).

The insulating layer 204 may include, for example, silicon oxide ($SiO_2$).

As illustrated in FIGS. 7A and 7B, the memory layer 300 includes, for example, a conductive layer 301, a barrier conductive layer 302, an electrode layer 303, a chalcogen layer 304, an electrode layer 305, a barrier conductive layer 306, a chalcogen layer 307, a barrier conductive layer 308, an electrode layer 309, a barrier conductive layer 310 and a conductive layer 311.

For example, as illustrated in FIGS. 7A and 7B, the conductive layer 301 is formed on the upper surface of the insulating layer 204. The conductive layer 301 may extend in the Y direction and function as a part of the lower layer bit line LBL. The conductive layer 301 may include, for example, tungsten (W).

The barrier conductive layer 302 is formed on the upper surface of the conductive layer 301. The barrier conductive layer 302 may extend in the Y direction and function as a part of the lower layer bit line LBL. The barrier conductive layer 302 may include, for example, tungsten nitride (WN).

The electrode layer 303 is formed on the upper surface of the barrier conductive layer 302. The electrode layer 303 may function as the cathode $E_C$ of the memory cell LMC. The electrode layer 303 may include, for example, carbon nitride (CN).

The chalcogen layer 304 is formed on the upper surface of the electrode layer 303. The chalcogen layer 304 may function as a nonlinear element NO. For example, when a voltage lower than a predetermined threshold voltage is applied to the chalcogen layer 304, the chalcogen layer 304 may be in a high resistance state. When the voltage applied to the chalcogen layer 304 reaches the predetermined threshold voltage, the chalcogen layer 304 may enter a low resistance state, and a current flowing through the chalcogen layer 304 may increase by several orders of magnitude. When the voltage applied to the chalcogen layer 304 falls below a predetermined voltage for a certain time, the chalcogen layer 304 may be again in a high resistance state.

The chalcogen layer 304 may include, for example, at least one kind of chalcogen. The chalcogen layer 304 may include, for example, chalcogenide, which is a compound containing chalcogen. Further, the chalcogen layer 304 may include at least one element selected from a group consisting of B, Al, Ga, In, C, Si, Ge, Sn, As, P and Sb.

Further, the chalcogen referred to here may be one excluding oxygen (O) among elements belonging to Group XVI of the periodic table. Chalcogen may include, for example, sulfur (S), selenium (Se), tellurium (Te) and the like.

The electrode layer 305 is formed on the upper surface of the chalcogen layer 304. The electrode layer 305 may function as an electrode connected to the variable resistance element VR and the nonlinear element NO. The electrode layer 305 may include, for example, carbon (C).

The barrier conductive layer 306 is formed on the upper surface of the electrode layer 305. The barrier conductive layer 306 may include, for example, tungsten nitride (WN).

The chalcogen layer 307 is formed on the upper surface of the barrier conductive layer 306. The chalcogen layer 307 may function as a variable resistance element VR. The chalcogen layer 307 may include, for example, a crystal region and a phase change region. The phase change region may be formed on the cathode side with respect to the crystal region. The phase change region may enter an amorphous state (reset state: high resistance state) by heating above the melting temperature and rapid cooling. In addition, the phase change region may enter a crystalline state (set state: low resistance state) by heating at a temperature lower than the melting temperature and higher than the crystallization temperature and slow cooling.

The chalcogen layer 307 may include, for example, at least one kind of chalcogen. The chalcogen layer 307 may include, for example, chalcogenide, which is a compound containing chalcogen. The chalcogen layer 307 may be, for example, GeSbTe, GeTe, SbTe, SiTe or the like. The chalcogen layer 307 may include at least one element selected from a group consisting of germanium (Ge), antimony (Sb) and tellurium (Te).

The barrier conductive layer 308 is formed on the upper surface of the chalcogen layer 307. The barrier conductive layer 308 may include, for example, tungsten nitride (WN).

The electrode layer 309 is formed on the upper surface of the barrier conductive layer 308. The electrode layer 309 may function as the anode $E_A$ of the memory cell LMC. The electrode layer 309 may include, for example, carbon (C).

The barrier conductive layer 310 is formed on the upper surface of the electrode layer 309. The barrier conductive layer 310 may extend in the X direction and function as a part of the word line WL. The barrier conductive layer 310 may include, for example, tungsten nitride (WN).

The conductive layer 311 is formed on the upper surface of the barrier conductive layer 310. The conductive layer 311 may extend in the X direction and function as a part of the word line WL. The conductive layer 311 may include, for example, tungsten (W).

In addition, for example, as illustrated in FIG. 5, a barrier insulating layer 321 and an insulating layer 322 formed therebetween are formed on the side surface of the memory layer 300 in the X direction. The barrier insulating layer 321 may include silicon nitride (SiN) or the like. The insulating layer 322 may include, for example, silicon oxide ($SiO_2$).

In addition, for example, as illustrated in FIG. 6, a barrier insulating layer 324 and an insulating layer 325 formed therebetween are formed on the side surface of the memory layer 300 in the Y direction. The barrier insulating layer 324 and the insulating layer 325 extend in the X direction. The barrier insulating layer 324 may include silicon nitride (SiN) or the like. The insulating layer 325 may include, for example, silicon oxide ($SiO_2$).

For example, as illustrated in FIGS. 7A and 7B, the memory layer 400 includes a conductive layer 401, a barrier conductive layer 402, an electrode layer 403, a chalcogen layer 404, an electrode layer 405, a barrier conductive layer 406, a chalcogen layer 407, a barrier conductive layer 408, an electrode layer 409, a barrier conductive layer 410 and a conductive layer 411.

For example, as illustrated in FIGS. 7A and 7B, the conductive layer 401 is formed on the upper surface of the conductive layer 311. The conductive layer 401 may extend in the X direction and function as a part of the word line WL. The conductive layer 401 may include, for example, tungsten (W).

The barrier conductive layer 402 is formed on the upper surface of the conductive layer 401. The barrier conductive layer 402 may extend in the X direction and function as a part of the word line WL. The barrier conductive layer 402 may include, for example, tungsten nitride (WN).

The electrode layer 403 is formed on the upper surface of the barrier conductive layer 402. The electrode layer 403 may function as the anode $E_A$ of the memory cell UMC. The electrode layer 403 may include, for example, carbon nitride (CN).

The chalcogen layer 404 is formed on the upper surface of the electrode layer 403. The chalcogen layer 404 may function as a nonlinear element NO, like the chalcogen layer 304. The chalcogen layer 404 may include, for example, the same material as the chalcogen layer 304.

The electrode layer 405 is formed on the upper surface of the chalcogen layer 404. The electrode layer 405 may function as an electrode connected to the variable resistance element VR and the nonlinear element NO. The electrode layer 405 may include, for example, carbon (C).

The barrier conductive layer 406 is formed on the upper surface of the electrode layer 405. The barrier conductive layer 406 may include, for example, tungsten nitride (WN).

The chalcogen layer 407 is formed on the upper surface of the barrier conductive layer 406. Like the chalcogen layer 307, the chalcogen layer 407 may function as a variable resistance element VR. The chalcogen layer 407 may include, for example, the same material as the chalcogen layer 307.

The barrier conductive layer 408 is formed on the upper surface of the chalcogen layer 407. The barrier conductive layer 408 may include, for example, tungsten nitride (WN).

The electrode layer 409 is formed on the upper surface of the barrier conductive layer 408. The electrode layer 409 may function as the cathode $E_C$ of the memory cell UMC. The electrode layer 409 may include, for example, carbon (C).

The barrier conductive layer 410 is formed on the upper surface of the electrode layer 409. The barrier conductive layer 410 may extend in the Y direction and function as a part of the upper layer bit line UBL. The barrier conductive layer 410 may include, for example, tungsten nitride (WN).

The conductive layer 411 is formed on the upper surface of the barrier conductive layer 410. The conductive layer 411 may extend in the Y direction and function as a part of the upper layer bit line UBL. The conductive layer 411 may include, for example, tungsten (W).

In addition, for example, as illustrated in FIG. 6, barrier insulating layers 421 and insulating layers 422 are formed on the side surface of the memory layer 400 in the Y direction. The insulating layer 422 is formed between the barrier insulating layer 421. The barrier insulating layer 421 may include silicon nitride (SiN) or the like. The insulating layer 422 may include, for example, silicon oxide ($SiO_2$).

In addition, for example, as illustrated in FIG. 5, barrier insulating layers 424 and insulating layers 425 are formed on the side surface of the memory layer 400 in the X direction. The insulating layer 425 is formed between the barrier insulating layer 424. The barrier insulating layer 424 and the insulating layer 425 extend in the Y direction. The barrier insulating layer 424 may include silicon nitride (SiN) or the like. The insulating layer 425 may include, for example, silicon oxide (SiO$_2$).

[Configuration of Insulation Layer]

Figure 8:
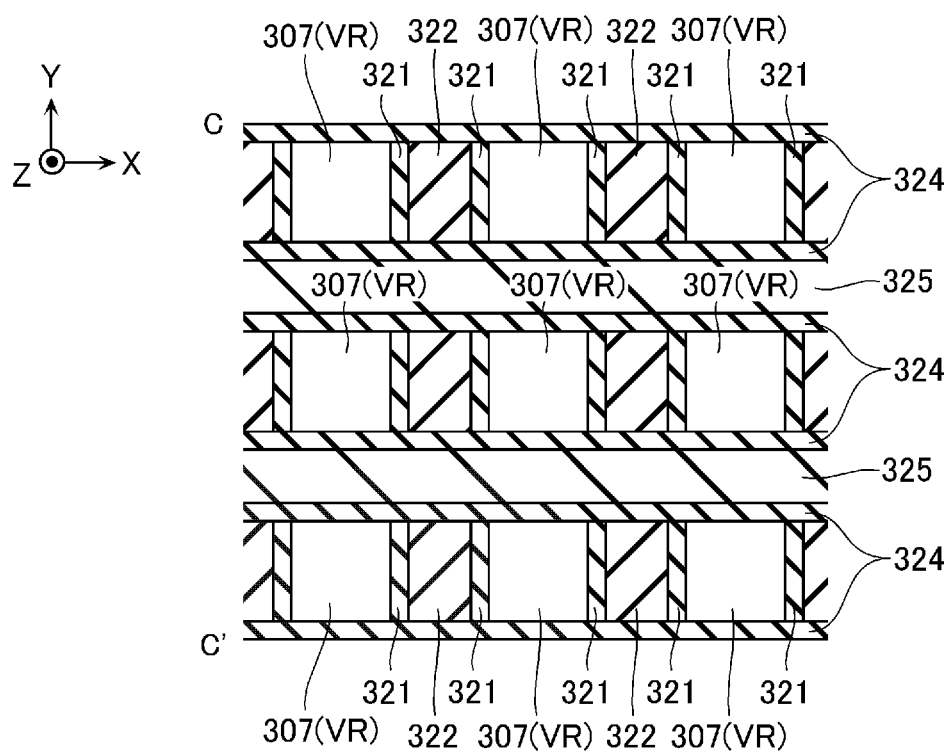
FIG. 8 is a schematic sectional view illustrating a partial configuration of the semiconductor storage device.
Figure 9:
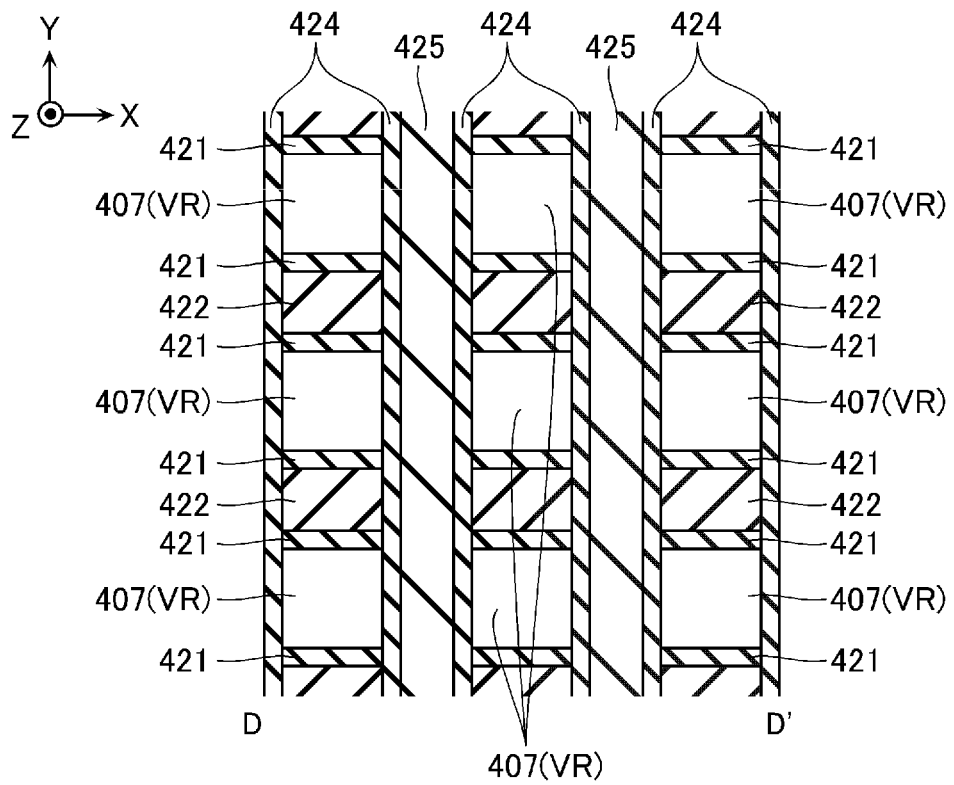
FIG. 9 is a schematic sectional view illustrating a partial configuration of the semiconductor storage device.

FIG. 8 is a schematic sectional view of the structure illustrated in FIG. 6, which is taken along line C-C' and viewed in the direction of an arrow. FIG. 9 is a schematic sectional view of the structure illustrated in FIG. 5, which is taken along line D-D' and viewed in the direction of an arrow.

As illustrated in FIG. 8, a barrier insulating layer 324 extending in the X direction is formed on the side surfaces in the Y direction of chalcogen layers 307 (VR) arranged in the X direction at a predetermined interval. An insulating layer 325 extending in the X direction is formed between barrier insulating layers 324 adjacent in the Y direction. Eventually, in the lower layer memory mat LMM, in each of the memory cells LMC each including a chalcogen layer 307 (VR), arranged in the X direction at a predetermined interval, the barrier insulating layer 324 extending in the X direction is formed on the side surface of each memory cell LMC in the Y direction, and the insulating layer 325 extending in the X direction is formed between the barrier insulating layers 324.

As illustrated in FIG. 9, a barrier insulating layer 424 extending in the Y direction is formed on the side surface in the X direction of each of chalcogen layers 407 (VR) arranged in the Y direction at a predetermined interval. An insulating layer 425 extending in the Y direction is formed between barrier insulating layers 424 adjacent in the X direction. Eventually, in the upper layer memory mat UMM, in each of the memory cells UMC each including a chalcogen layer 407 (VR), arranged in the Y direction at a predetermined interval, the barrier insulating layer 424 extending in the Y direction is formed on the side surface of each memory cell UMC in the X direction, and the insulating layer 425 extending in the Y direction is formed between the barrier insulating layers 424.

[Current-Voltage Characteristics of Memory Cell]

Figure 10:
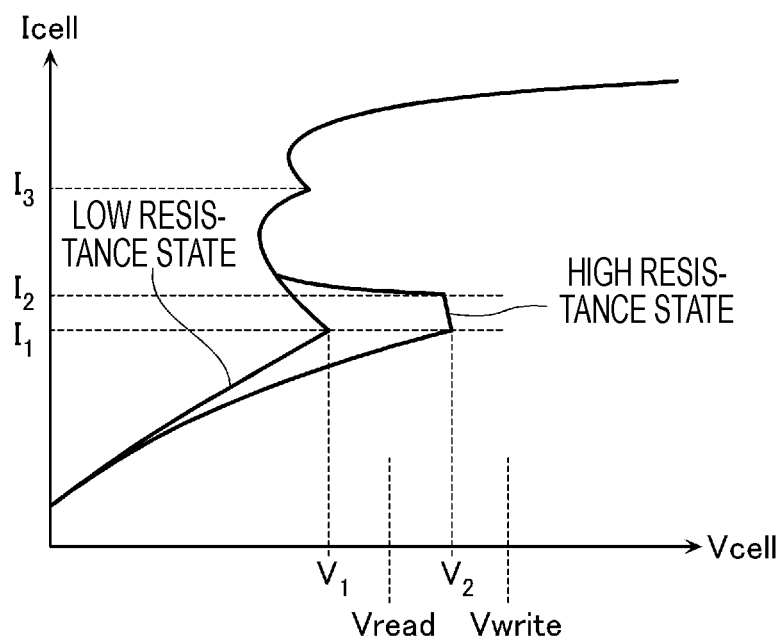
FIG. 10 is a schematic graph illustrating the current-voltage characteristics of a memory cell.

FIG. 10 is a schematic graph illustrating the current-voltage characteristics of the memory cells LMC and UMC of the semiconductor storage device according to the present embodiment. The horizontal axis represents a cell voltage Vcell which is the voltage of the anode $E_A$ with respect to the cathode $E_C$ of the memory cells LMC and UMC. The vertical axis represents a cell current Icell flowing through the memory cells LMC and UMC on a logarithmic axis.

In a range where the cell current Icell is smaller than a predetermined current value $I_1$, the cell voltage Vcell monotonously increases as the cell current Icell increases. At the point of time when the cell current Icell reaches the current value $I_1$, the cell voltage Vcell of the memory cells LMC and UMC in the low resistance state may reach a voltage $V_1$. The cell voltage Vcell of the memory cells LMC and UMC in the high resistance state may reach a voltage $V_2$. The voltage $V_2$ may be larger than the voltage $V_1$.

In a range where the cell current Icell is larger than the current value $I_1$ and smaller than a current value $I_2$, the cell voltage Vcell may monotonously decrease as the cell current Icell increases. In this range, the cell voltage Vcell of the memory cells LMC and UMC in the high resistance state may be larger than the cell voltage Vcell of the memory cells LMC and UMC in the low resistance state.

In a range where the cell current Icell is larger than the current value $I_2$ and smaller than a current value $I_3$, the cell voltage Vcell may temporarily decrease and then increase as the cell current Icell increases. In this range, as the cell current Icell increases, the cell voltage Vcell of the memory cells LMC and UMC in the high resistance state may sharply decrease to the same level as the cell voltage Vcell of the memory cells LMC and UMC in the low resistance state.

In a range where the cell current Icell is larger than the current value $I_3$, the cell voltage Vcell temporarily may decrease and then increase as the cell current Icell increases.

From this state, when the cell current Icell is rapidly decreased to a value smaller than the current value $I_1$, the chalcogen layers 307 and 407 may be in the high resistance state. In addition, when the cell current Icell is maintained at a current between the current value $I_2$ and the current value $I_3$ for a certain time or more and then is decreased to a value smaller than the current value $I_1$, the chalcogen layers 307 and 407 may enter the low resistance state.

In a read operation, for example, assuming that the cell voltage Vcell is a read voltage Vread that is larger than the voltage $V_2$ and smaller than the voltage $V_2$, it may be detected whether the cell current Icell in this state is larger than a threshold current. The threshold current may be set to equal to or larger than, for example, the current value $I_1$.

In a write operation, for example, first, the cell voltage Vcell may be adjusted to a write voltage Vwrite higher than the voltage $V_2$. Next, when the memory cells LMC and UMC are desired to be in the high resistance state, for example, the cell voltage Vcell may be decreased to 0V within a predetermined time. Meanwhile, when the memory cells LMC and UMC are desired to be in the low resistance state, for example, the cell voltage Vcell may be set to 0V over a certain time.

[Control of Write Operation]

Next, a control operation when a write operation is performed on a selected memory cell in the semiconductor storage device according to the present embodiment will be described with reference to FIGS. 11 to 15.

Figure 11:
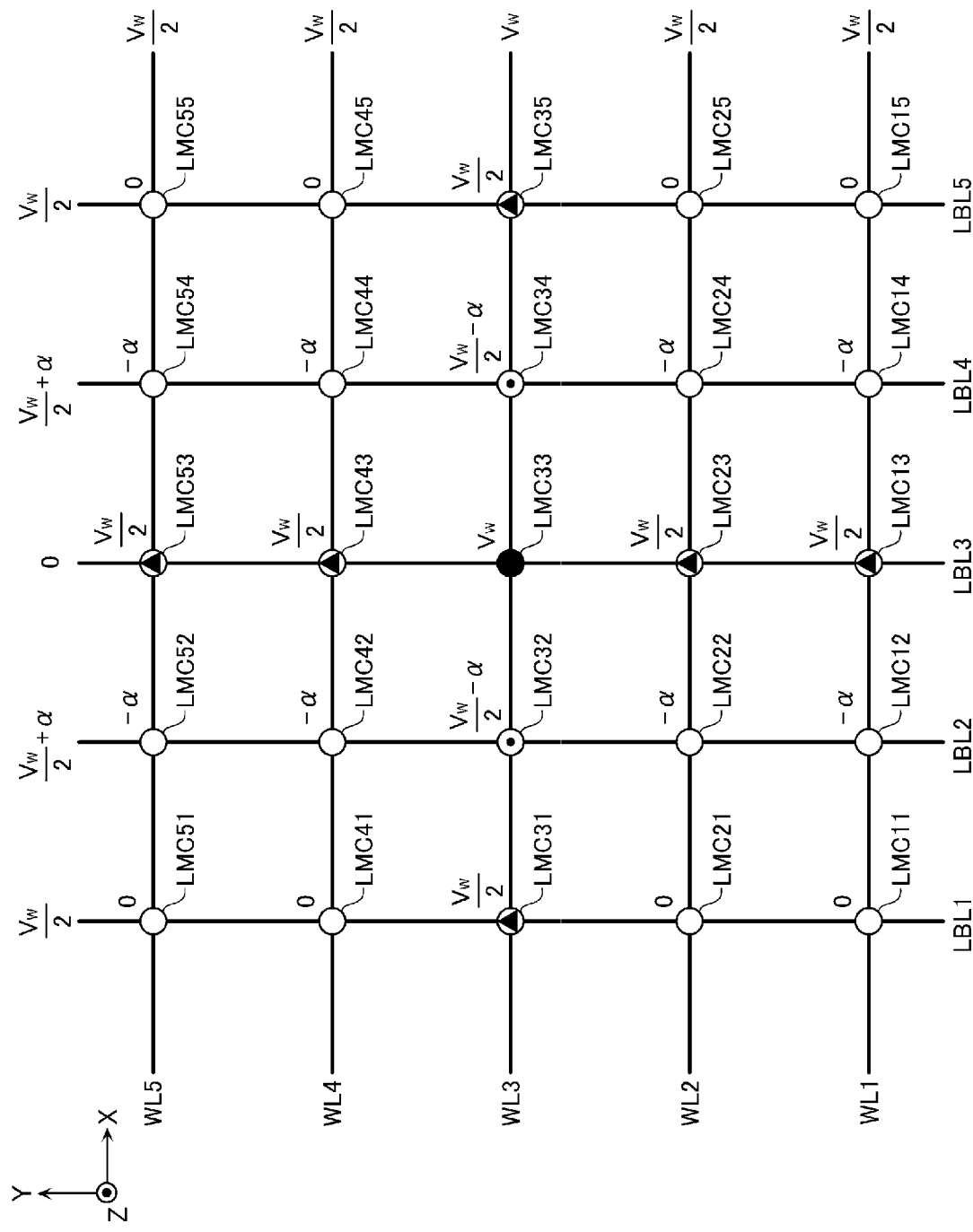
FIG. 11 is a schematic view corresponding to a partial plane of the semiconductor storage device.
Figure 12:
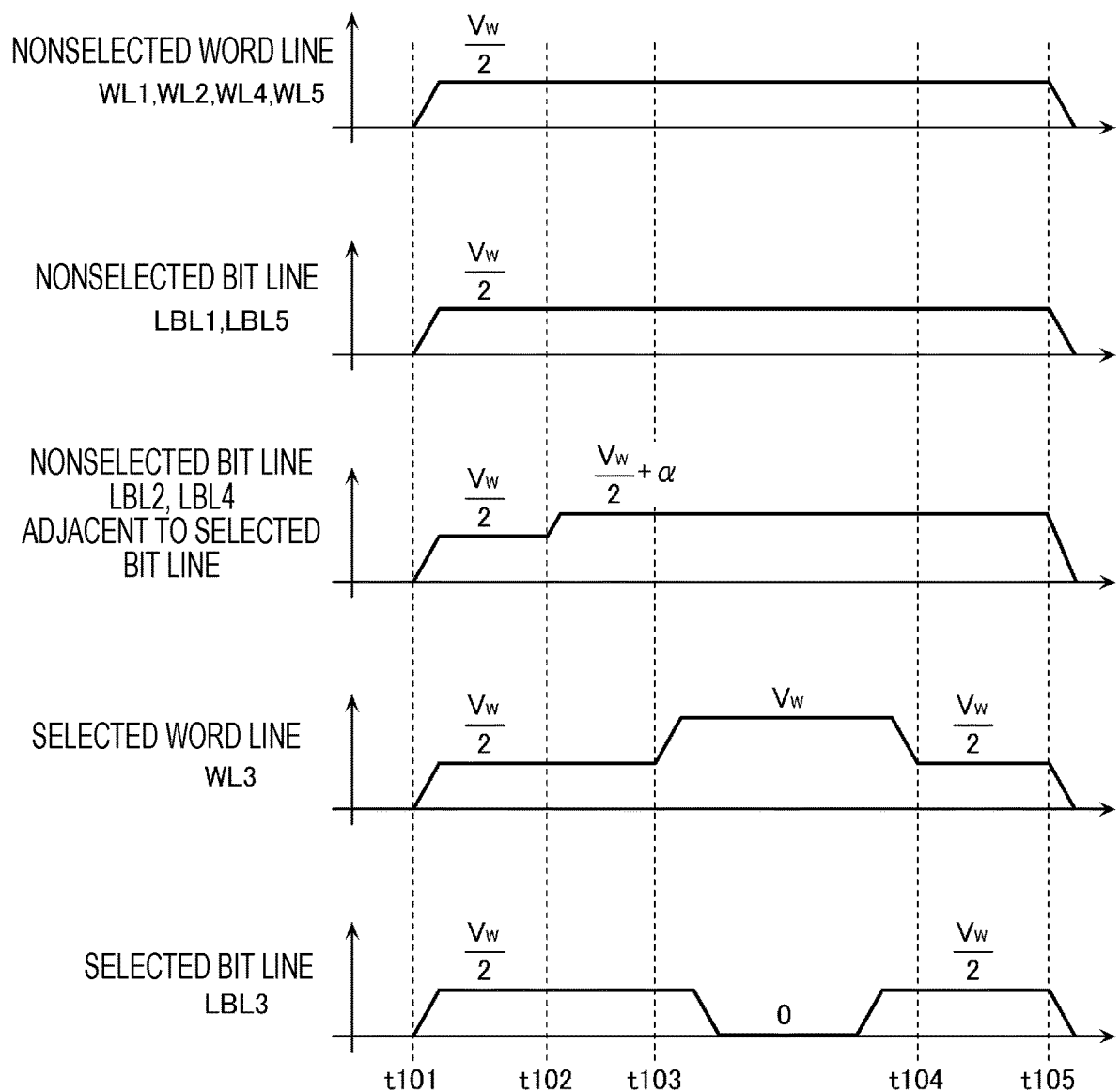
FIG. 12 is a schematic voltage waveform diagram illustrating a write operation.
Figure 13:
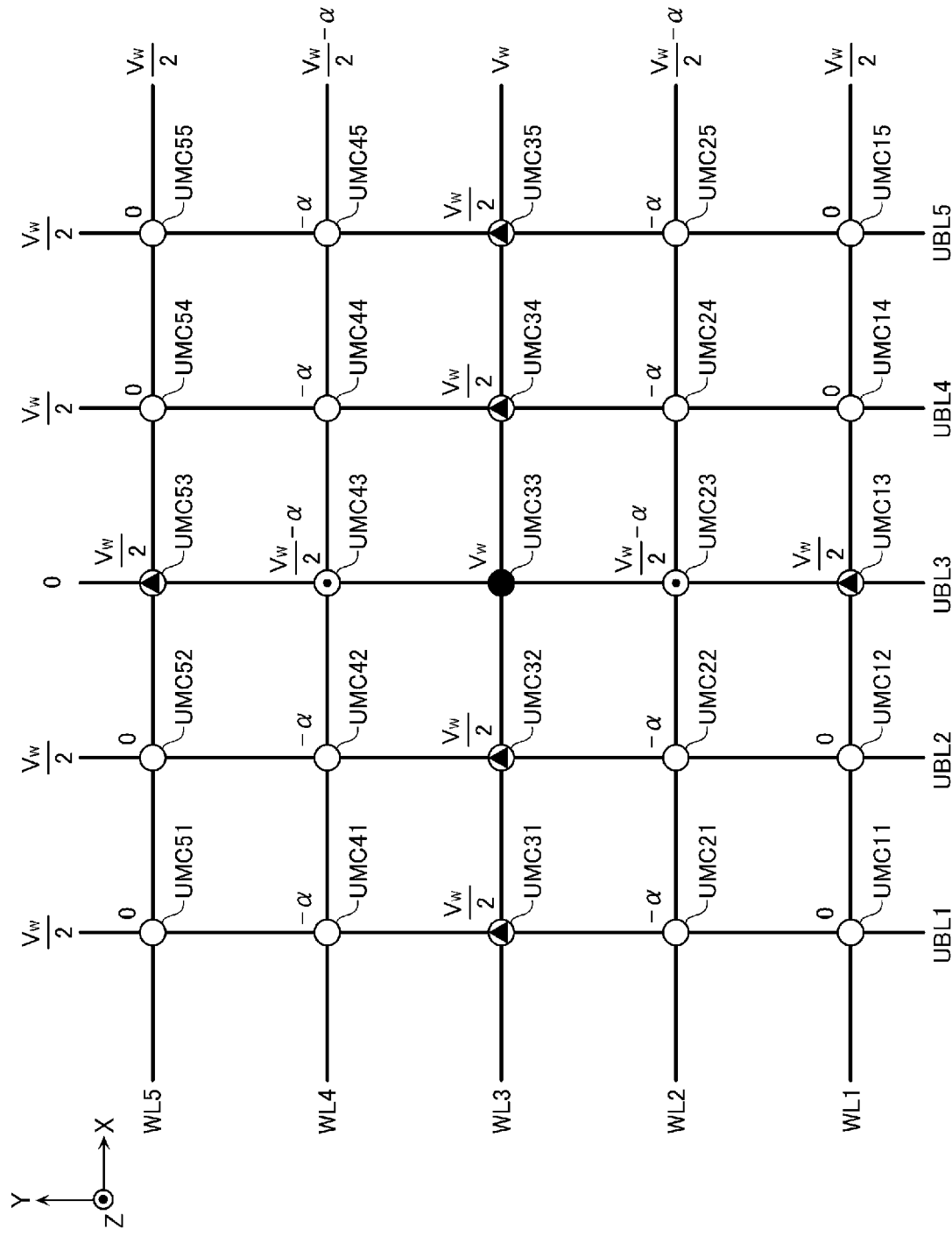
FIG. 13 is a schematic view corresponding to a partial plane of the semiconductor storage device.
Figure 14:
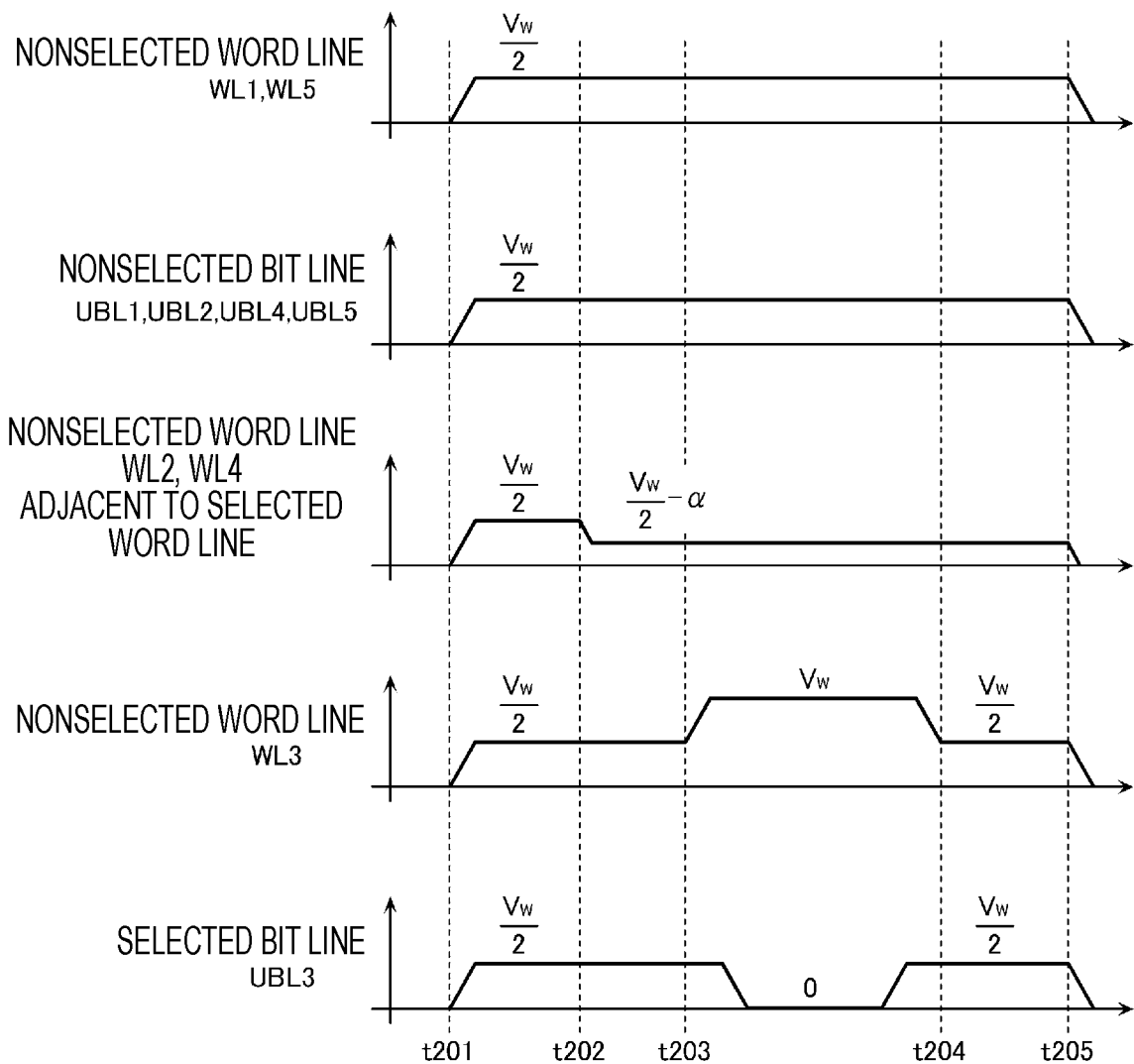
FIG. 14 is a schematic voltage waveform diagram illustrating a write operation.
Figure 15:
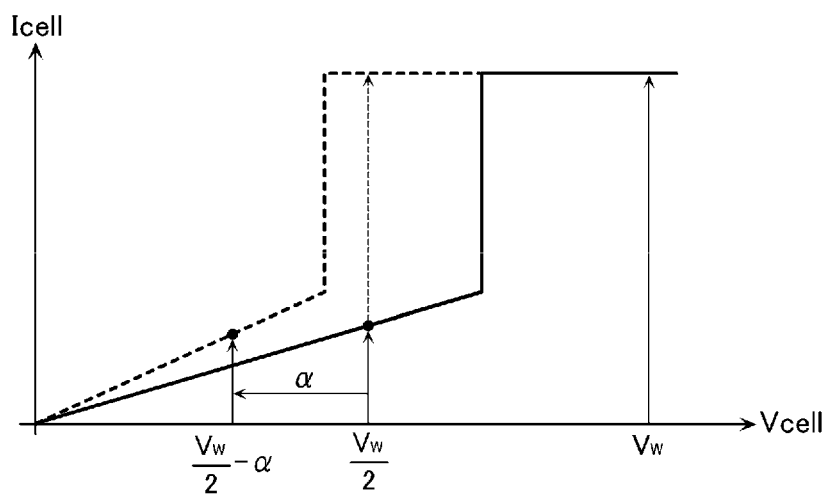
FIG. 15 is a schematic graph illustrating the voltage-current characteristics in a write operation of a memory cell of the semiconductor storage device.

FIG. 11 is a schematic view corresponding to a partial plane of the lower layer memory mat LMM in the memory cell array MCA of the semiconductor storage device according to the present embodiment. FIG. 12 is a schematic voltage waveform diagram illustrating a write operation for the memory cell LMC in the lower layer memory mat LMM. FIG. 13 is a schematic view corresponding to the plane of the upper layer memory mat UMM in the memory cell array MCA of the semiconductor storage device according to the present embodiment. FIG. 14 is a schematic voltage waveform diagram illustrating a write operation for the memory cell UMC in the upper layer memory mat UMM. FIG. 15 is a schematic graph illustrating the voltage-current characteristics in the write operation of the memory cells LMC and UMC of the semiconductor storage device according to the present embodiment.

[Write Operation in Lower Layer Memory Mat LMM]

First, a write operation for the memory cell LMC in the lower layer memory mat LMM will be described with reference to FIGS. 11 and 12. In FIGS. 11 and 12, a "numerical sign" is added to each word line WL, each lower layer bit line LBL, and each memory cell LMC. The numerical sign is given to clarify the positional relationship among each word line WL, each lower layer bit line LBL, and each memory cell LMC, and does not represent a specific fixed word line WL, lower layer bit line LBL, and memory cell LMC.

When a write operation is performed on the memory cells in the lower layer memory mat LMM, the power supply circuit 15 (see FIG. 1) may output the following voltages based on control of the control circuit 16 (see FIG. 1).

A write voltage Vw may be output as the high voltage side voltage Vp for a selected word line. A voltage Vw/2 may be output as the voltage VUX for a nonselected word line.

A voltage 0 may be output as the low voltage side voltage Vn for a selected bit line. A voltage Vw/2 may be output as the voltage VUB for a nonselected bit line. A voltage (Vw/2)+α may be output as the voltage VNB for a nonselected bit line. For example, the value of a may be smaller than the value of (Vw/2).

When a write operation is performed on a selected memory cell LMC33 illustrated in FIG. 11, the row decoder 12 (see FIG. 1) may supply (transfer) each voltage to each word line WL at a timing illustrated in FIG. 12 based on control of the control circuit 16 (see FIG. 1) and a row address supplied from the upper block decoder 14 (see FIG. 1). The column decoder 13 (see FIG. 1) may also supply (transfer) each voltage to each bit line LBL at a timing illustrated in FIG. 12 based on control of the control circuit 16 (see FIG. 1) and a column address supplied from the upper block decoder 14 (see FIG. 1).

In the example illustrated in FIG. 12, the voltage Vw/2 may be supplied to all of the word lines WL1 to WL5, the bit lines LBL1 to LBL5, and the upper layer bit line UBL (not illustrated) over a period from a timing t101 to a timing t102.

In addition, in the example illustrated in FIG. 12, the voltage (Vw/2)+α may be supplied to the nonselected bit lines LBL2 and LBL4 adjacent to the selected bit line LBL3 in the X direction over a period from the timing t102 to a timing t103. A voltage supplied to the other lines may be the same as that supplied over the period from the timing t101 to the timing t102.

In addition, in the example illustrated in FIG. 12, the voltage Vw may be supplied to the selected word line WL3 and the voltage 0 may be supplied to the selected bit line LBL3 over a period from the timing t103 to a timing t104. A voltage supplied to the other lines may be the same as that supplied over the period from the timing t102 to the timing t103.

In addition, in the example illustrated in FIG. 12, the voltage Vw/2 may be supplied to the selected word line WL3 and the voltage Vw/2 may be output to the selected bit line LBL3 over a period from the timing t104 to a timing t105. In some embodiments, the magnitude of the voltage supplied to the selected word line WL3 and the magnitude of the voltage output to the selected bit line LBL3 match or substantially match each other. A voltage supplied to the other lines may be the same as that supplied over the period from the timing t103 to the timing t104.

In addition, in the example illustrated in FIG. 12, the voltage 0 may be supplied to all of the word lines WL1 to WL5, the bit lines LBL1 to LBL5, and the upper layer bit line UBL (not illustrated) after the timing t105.

FIG. 11 illustrates voltages applied to the memory cells LMC11 to LMC55 when voltages are supplied over the period from the timing t103 to the timing t104 as described above, that is, when the voltage Vw is supplied to the selected word line WL3, the voltage Vw/2 may be supplied to the nonselected word lines WL1, WL2, WL4 and WL5, the voltage 0 may be supplied to the selected bit line LBL3, the voltage (Vw/2)+α may be supplied to the nonselected bit lines LBL2 and LBL4 adjacent to the selected bit line LBL3 in the X direction, and the voltage Vw/2 may be supplied to the nonselected bit lines LB1 and LB5. The states of the memory cells LMC in relation to the applied voltages may be as indicated in the followings (1) to (3).

(1) The voltage Vw may be applied to the selected memory cell LMC33. Therefore, in the selected memory cell LMC33, a large current may flow in the chalcogen layer 304 (nonlinear element NO), and the phase change region of the chalcogen layer 307 (variable resistance element VR) may be melted or crystallized. Accordingly, after the timing t104, the voltage applied to the selected memory cell LMC33 may be rapidly decreased, that is, the temperature of the chalcogen layer 307 (variable resistance element VR) may be rapidly decreased, whereby the phase change region of the chalcogen layer 307 (variable resistance element VR) may enter an amorphous state (reset state: high resistance state). Further, after the timing t104, the temperature of the chalcogen layer 307 (variable resistance element VR) may be decreased, whereby the phase change region of the chalcogen layer 307 (variable resistance element VR) may enter a crystalline state (set state: low resistance state).

(2) The voltage Vw/2, the voltage 0 or the voltage −α may be applied to the nonselected memory cells other than the nonselected memory cells LMC32 and LMC34 among the nonselected memory cells. That is, a voltage equal to or lower than the voltage Vw/2 may be applied to the nonselected memory cells other than the memory cells LMC32 and LMC34 among the nonselected memory cells. Therefore, it is possible that a large current does not flow in the nonselected memory cells other than the memory cells LMC32 and LMC34 among the nonselected memory cells. Accordingly, it is possible that the states of the nonselected memory cells other than the nonselected memory cells LMC32 and LMC34 do not change.

(3) A voltage (Vw/2)−α smaller than the voltage Vw/2 may be applied to the nonselected memory cells LMC32 and LMC34 adjacent to the selected memory cell LMC33 at a predetermined interval in the X direction among the nonselected memory cells. In this manner, since the voltage (Vw/2)−α smaller than the voltage Vw/2 is applied to the nonselected memory cells LMC32 and LMC34, it is possible that a large current does not flow in the nonselected memory cells LMC32 and LMC34. Accordingly, it is possible that the states of the nonselected memory cells LMC32 and LMC34 do not change. The reason why the voltage (Vw/2)−α smaller than the voltage Vw/2 is applied only to the nonselected memory cells LMC32 and LMC34 particularly among the nonselected memory cells will be described later with reference to FIG. 15.

Further, the methods illustrated in FIGS. 11 and 12 are merely examples and may be adjusted as appropriate. For example, it is also possible to supply the voltage Vw/2 to the selected word line WL3, a voltage −Vw/2 to the selected bit line LBL3, the voltage 0V to the nonselected word lines WL1, WL2, WL4 and WL5 and the nonselected bit lines LBL1 and LBL5, and a voltage α to the nonselected bit lines LBL2 and LBL4.

[Write Operation in Upper Layer Memory Mat UMM]

Next, a write operation for the memory cell UMC in the upper layer memory mat UMM will be described with reference to FIGS. 13 and 14. In FIGS. 13 and 14, a "numerical sign" is added to each word line WL, each upper layer bit line UBL, and each memory cell UMC. The numerical sign is given to clarify the positional relationship among each word line WL, each upper layer bit line UBL, and each memory cell UMC, and does not represent a specific fixed word line WL, upper layer bit line UBL, and memory cell UMC.

When a write operation is performed on the memory cells in the upper layer memory mat UMM, the power supply circuit 15 (see FIG. 1) may output the following voltages based on control of the control circuit 16 (see FIG. 1).

A write voltage Vw may be output as the high voltage side voltage Vp for a selected word line. A voltage Vw/2 may be output as the voltage VUX for a nonselected word line. A voltage (Vw/2)–α may be output as the voltage VNX for a nonselected word line. For example, the value of α may be smaller than the value of (Vw/2).

A voltage 0 may be output as the low voltage side voltage Vn for a selected bit line. A voltage Vw/2 may be output as the voltage VUB for a nonselected bit line.

When a write operation is performed on a selected memory cell UMC33 illustrated in FIG. 13, the row decoder 12 (see FIG. 1) may supply (transfer) each voltage to each word line WL at a timing illustrated in FIG. 14 based on control of the control circuit 16 (see FIG. 1) and a row address supplied from the upper block decoder 14 (see FIG. 1). The column decoder 13 (see FIG. 1) may supply (transfer) each voltage to each bit line UBL at a timing illustrated in FIG. 14 based on control of the control circuit 16 (see FIG. 1) and a column address supplied from the upper block decoder 14 (see FIG. 1).

In the example illustrated in FIG. 14, the voltage Vw/2 may be supplied to all of the word lines WL1 to WL5, the bit lines UBL1 to UBL5, and the lower layer bit line LBL (not illustrated) over a period from a timing t201 to a timing t202.

In addition, in the example illustrated in FIG. 14, the voltage (Vw/2)–α may be supplied to the nonselected word lines WL2 and WL4 adjacent to the selected word line WL3 in the Y direction over a period from the timing t202 to a timing t203. A voltage supplied to the other lines may be the same as that supplied over the period from the timing t201 to the timing t202.

In addition, in the example illustrated in FIG. 14, the voltage Vw may be supplied to the selected word line WL3 and the voltage 0 may be supplied to the selected bit line UBL3 over a period from the timing t203 to a timing t204. A voltage supplied to the other lines may be the same as that supplied over the period from the timing t202 to the timing t203.

In addition, in the example illustrated in FIG. 14, the voltage Vw/2 may be supplied to the selected word line WL3 and the voltage Vw/2 may be output to the selected bit line LBL3 over a period from the timing t204 to a timing t205. A voltage supplied to the other lines may be the same as that supplied over the period from the timing t203 to the timing t204.

In addition, in the example illustrated in FIG. 14, the voltage 0 may be supplied to all of the word lines WL1 to WL5, the bit lines UBL1 to UBL5, and the lower layer bit line LBL (not illustrated) after the timing t205.

FIG. 13 illustrates voltages applied to the memory cells UMC11 to UMC55 when voltages are supplied over the period from the timing t203 to the timing t204 as described above, that is, when the voltage Vw is supplied to the selected word line WL3, the voltage (Vw/2)–α may be supplied to the nonselected word lines WL2 and WL4 adjacent to the selected word line WL3 in the Y direction, the voltage Vw/2 may be supplied to the nonselected word lines WL1 and WL5, the voltage 0 may be supplied to the selected bit line UBL3, and the voltage Vw/2 may be supplied to the nonselected bit lines UB1, UB2, UB4 and UB5. The states of the memory cells UMC in relation to these applied voltages may be as indicated in the followings (4) to (6).

(4) The voltage Vw may be applied to the selected memory cell UMC33. Therefore, in the selected memory cell UMC33, a large current may flow in the chalcogen layer 404 (nonlinear element NO), and the phase change region of the chalcogen layer 407 (variable resistance element VR) may be melted or crystallized. Accordingly, after the timing t204, the voltage applied to the selected memory cell UMC33 may be rapidly decreased, that is, the temperature of the chalcogen layer 407 (variable resistance element VR) may be rapidly decreased, whereby the phase change region of the chalcogen layer 407 (variable resistance element VR) may enter an amorphous state (reset state: high resistance state). Further, after the timing t204, the temperature of the chalcogen layer 407 (variable resistance element VR) may be decreased, whereby the phase change region of the chalcogen layer 407 (variable resistance element VR) may enter a crystalline state (set state: low resistance state).

(5) The voltage Vw/2, the voltage 0 or the voltage –α may be applied to the nonselected memory cells other than the nonselected memory cells UMC23 and UMC43 among the nonselected memory cells. That is, a voltage equal to or lower than the voltage Vw/2 may be applied to the nonselected memory cells other than the memory cells UMC23 and UMC43 among the nonselected memory cells. Therefore, it is possible that a large current does not flow in the nonselected memory cells other than the memory cells UMC23 and UMC43 among the nonselected memory cells. Accordingly, it is possible that the states of the nonselected memory cells other than the nonselected memory cells UMC23 and UMC43 do not change.

(6) A voltage (Vw/2)–α smaller than the voltage Vw/2 may be applied to the nonselected memory cells UMC23 and UMC43 adjacent to the selected memory cell UMC33 at a predetermined interval in the Y direction among the nonselected memory cells. In this manner, since the voltage (Vw/2)–α smaller than the voltage Vw/2 is applied to the nonselected memory cells UMC23 and UMC43, it is possible that a large current does not flow in the nonselected memory cells UMC23 and UMC43. Accordingly, it is possible that the states of the nonselected memory cells UMC23 and UMC43 do not change. The reason why the voltage (Vw/2)–α smaller than the voltage Vw/2 is applied only to the nonselected memory cells UMC23 and UMC43 particularly among the nonselected memory cells will be described later with reference to FIG. 15.

Further, the methods illustrated in FIGS. 13 and 14 are merely examples and may be adjusted as appropriate. For example, it is also possible to supply the voltage Vw/2 to the selected word line WL3, a voltage –Vw/2 to the selected bit line UBL3, the voltage 0 to the nonselected word lines WL1 and WL5 and the nonselected bit lines UBL1, UBL2, UBL4 and UBL5, and a voltage –α to the nonselected word lines WL2 and WL4.

[Operation of Memory Cell in Write Operation, Etc.]

Here, the operation state of the memory cells LMC and UMC and the write voltage Vw in the write operation will be described with reference to FIG. 15. In FIG. 15, the horizontal axis represents a cell voltage Vcell that is the voltage of the anode $E_A$ with respect to the cathode $E_C$ of the memory cells LMC and UMC. The vertical axis represents a cell current Icell flowing through the memory cells LMC and UMC on a logarithmic axis. A solid line indicates characteristics when the temperature of the memory cells LMC and UMC is lower than a predetermined temperature.

A dotted line indicates characteristics when the memory cells LMC and UMC are heated and the temperature thereof is equal to or higher than the predetermined temperature.

As illustrated in FIG. 15, assuming that the cell voltage Vcell applied to the memory cells LMC and UMC is the write voltage Vw, a large current may flow in the memory cells LMC and UMC, and the phase change region in the chalcogen layers 307 and 407 (VR) may be melted or crystallized.

When the temperature of the memory cells LMC and UMC is lower than the predetermined temperature, the voltage $V_2$ (FIG. 10) may be higher than the voltage Vw/2, as indicated by the solid line in FIG. 15. Therefore, when an applied voltage is Vw/2, it is possible that the cell current Icell does not reach the current value $I_1$ (FIG. 10), and a large current does not flow in the memory cells LMC and UMC. Accordingly, it is possible that the states of the memory cells LMC and UMC do not change.

Meanwhile, when the temperature of the memory cells LMC and UMC is equal to or higher than the predetermined temperature, the voltage $V_2$ (FIG. 10) may become lower than the voltage Vw/2, as indicated by the dotted line in FIG. 15. Therefore, even when the voltage applied to the memory cells LMC and UMC is Vw/2, the cell current Icell may reach the current value $I_1$ (FIG. 10), and a large current may flow in the memory cells LMC and UMC. Accordingly, the states of the memory cells LMC and UMC may change.

However, even when the temperature of the memory cells LMC and UMC is equal to or higher than the predetermined temperature and the characteristics indicated by the dotted line in FIG. 15 are obtained, when the voltage applied to the memory cells LMC and UMC is Vw/2−α, it is possible that no large current flows in the memory cells LMC and UMC, and the states thereof do not change.

Here, descriptions will be made below on one reason why the temperature of the nonselected memory cells adjacent to the selected memory cell becomes higher than the predetermined temperature when the temperature of the selected memory cell increases. That is, when a current flows in the selected memory cell, the temperature of the selected memory cell may increase. The memory cells adjacent to the selected memory cell may be heated to the predetermined temperature or higher due to the transfer of heat from the selected memory cell.

More specifically, a case of the memory cell LMC in the lower layer memory mat LMM and a case of the memory cell UMC in the upper layer memory mat UMM will be described separately.

In the case of the memory cell LMC in the lower layer memory mat LMM, for example, as illustrated in FIG. 11, when the temperature of the selected memory cell LMC33 increases in the write operation of the selected memory cell LMC33, the temperature of the nonselected memory cells LMC32 and LMC34 adjacent to the selected memory cell LMC33 at a predetermined interval in the X direction may increase to a predetermined temperature or higher.

The reason will be described with reference to FIG. 8. As illustrated in FIG. 8, in the lower layer memory mat LMM, in each of memory cells LMC (chalcogen layer 307 (VR)) arranged at a predetermined interval in the X direction, the barrier insulating layer 324 and the insulating layer 325 extending in the X direction may be formed on the side surface of each memory cell LMC in the Y direction. Therefore, the heat of the selected memory cell LMC33 in FIG. 11 may be transferred to the nonselected memory cells LMC32 and LMC34 through the barrier insulating layer 324 and the insulating layer 325, and the temperature of the nonselected memory cells LMC32 and LMC34 may increase, which is proved with a result of simulation verification.

In particular, since the barrier insulating layer 324 is in contact with the side surfaces of the plurality of memory cells LMC and silicon nitride (SiN) that is a material thereof has a higher thermal conductivity than silicon oxide ($SiO_2$) that is a material of the insulating layer 325, more heat may be transferred by the barrier insulating layer 324 than by the insulating layer 325, which is proved with a result of simulation verification.

As described above, the temperature of the nonselected memory cells LMC32 and LMC34 adjacent to the selected memory cell LMC33 at a predetermined interval in the X direction may increase to the predetermined temperature or higher. Therefore, in the present embodiment, the voltage (Vw/2)−α smaller than the voltage Vw/2 may be applied to the nonselected memory cells LMC32 and LMC34, thereby preventing a change in the states of the nonselected memory cells LMC32 and LMC34. That is, even when the temperature of the nonselected memory cells LMC32 and LMC34 is equal to or higher than the predetermined temperature and the nonselected memory cells LMC32 and LMC34 have the characteristics indicated by the dotted line in FIG. 15, since the applied voltage is the voltage (Vw/2)−α, it is possible that no large current flows in the nonselected memory cells LMC32 and LMC34, and the states thereof do not change.

In the case of the memory cell UMC in the upper layer memory mat UMM, for example, as illustrated in FIG. 13, when the temperature of the selected memory cell UMC33 increases in the write operation of the selected memory cell UMC33, the temperature of the nonselected memory cells UMC23 and UMC43 adjacent to the selected memory cell UMC33 at a predetermined interval in the Y direction may increase to a predetermined temperature or higher.

The reason will be described with reference to FIG. 9. As illustrated in FIG. 9, in the upper layer memory mat UMM, in each of memory cells UMC (chalcogen layer 407 (VR)) arranged at a predetermined interval in the Y direction, the barrier insulating layer 424 and the insulating layer 425 extending in the Y direction are formed on the side surface of each memory cell UMC in the X direction. Therefore, the heat of the selected memory cell UMC33 in FIG. 13 is transferred to the nonselected memory cells UMC23 and UMC43 through the barrier insulating layer 424 and the insulating layer 425, and the temperature of the nonselected memory cells UMC23 and UMC43 increases, which is proved with a result of simulation verification.

In particular, since the barrier insulating layer 424 is in contact with the side surfaces of the plurality of memory cells UMC and silicon nitride (SiN) that is a material thereof has a higher thermal conductivity than silicon oxide ($SiO_2$) that is a material of the insulating layer 425, more heat may be transferred by the barrier insulating layer 424 than by the insulating layer 425, which is proved with a result of simulation verification.

As described above, the temperature of the nonselected memory cells UMC23 and UMC43 adjacent to the selected memory cell UMC33 at a predetermined interval in the Y direction may increase to the predetermined temperature or higher. Therefore, in the present embodiment, the voltage (Vw/2)−α smaller than the voltage Vw/2 may be applied to the nonselected memory cells UMC23 and UMC43, thereby preventing a change in the states of the nonselected memory cells UMC23 and UMC43. That is, even when the temperature of the nonselected memory cells UMC23 and UMC43 is equal to or higher than the predetermined temperature and the nonselected memory cells UMC23 and UMC43 have the characteristics indicated by the dotted line in FIG. 15, since the applied voltage is the voltage (Vw/2)−α, it is possible that no large current flows in the nonselected memory cells UMC23 and UMC43, and the states thereof do not change.

Second Embodiment

Next, a semiconductor storage device according to a second embodiment will be described with reference to FIGS. 16 to 18. Descriptions about the same configurations and the same functions as the first embodiment are omitted, and only portions peculiar to the second embodiment will be described.

Figure 16:
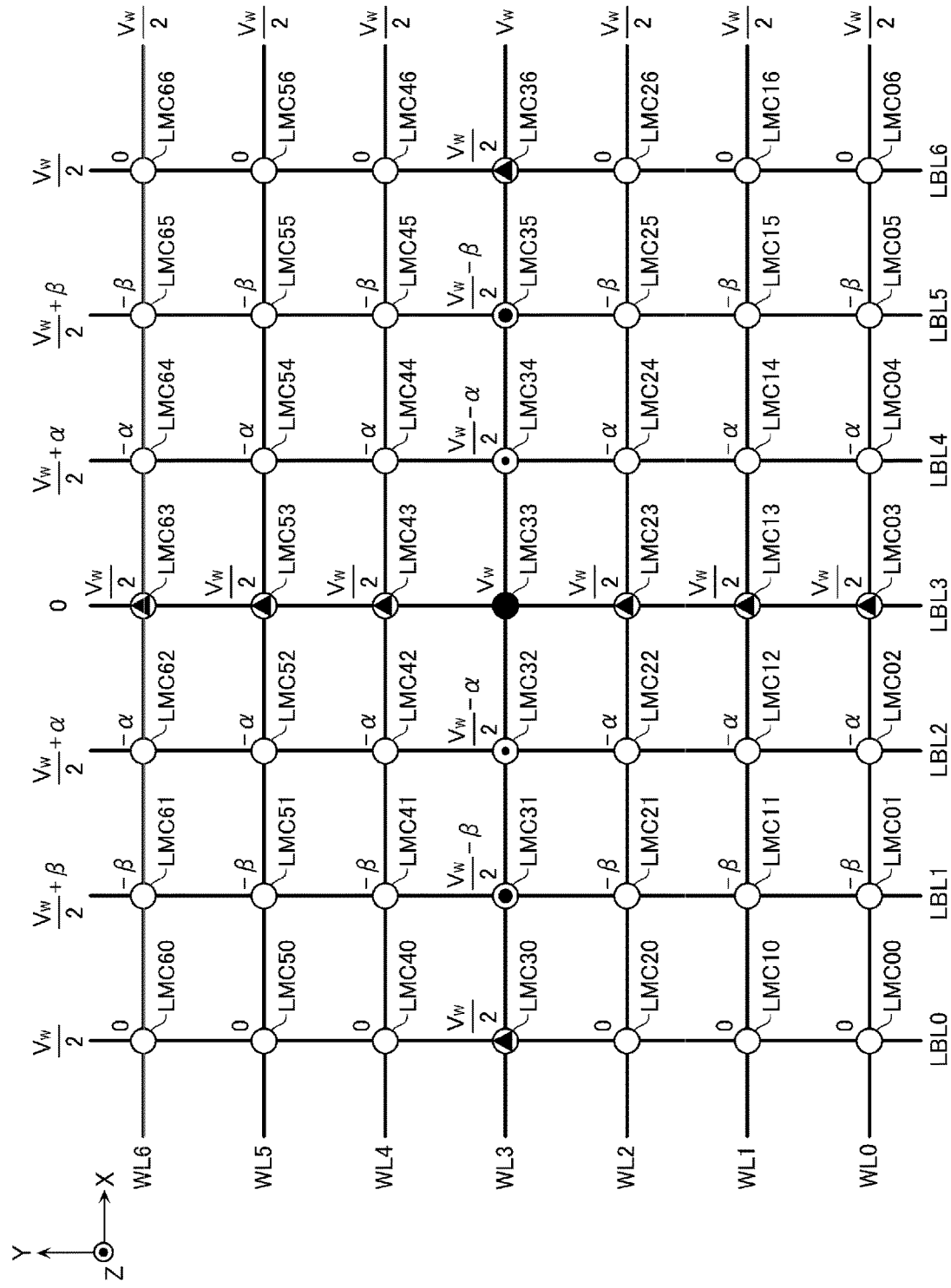
FIG. 16 is a schematic view corresponding to a partial plane of a semiconductor storage device according to a second embodiment.

FIG. 16 is a schematic view corresponding to a partial plane of a lower layer memory mat LMM in a memory cell array MCA of the semiconductor storage device according to the present embodiment. FIG. 17 is a schematic view corresponding to a partial plane of an upper memory mat UMM in the memory cell array MCA of the semiconductor storage device according to the present embodiment. In FIGS. 16 and 17, a "numerical sign" is added to each word line WL, each bit line LBL and UBL, and each memory cell LMC and UMC. The numerical sign is given to clarify the positional relationship among each word line WL, each bit line LBL and UBL, and each memory cell LMC and UMC, and does not represent a specific fixed word line WL, bit line LBL and UBL, and memory cell LMC and UMC.

Figure 18:
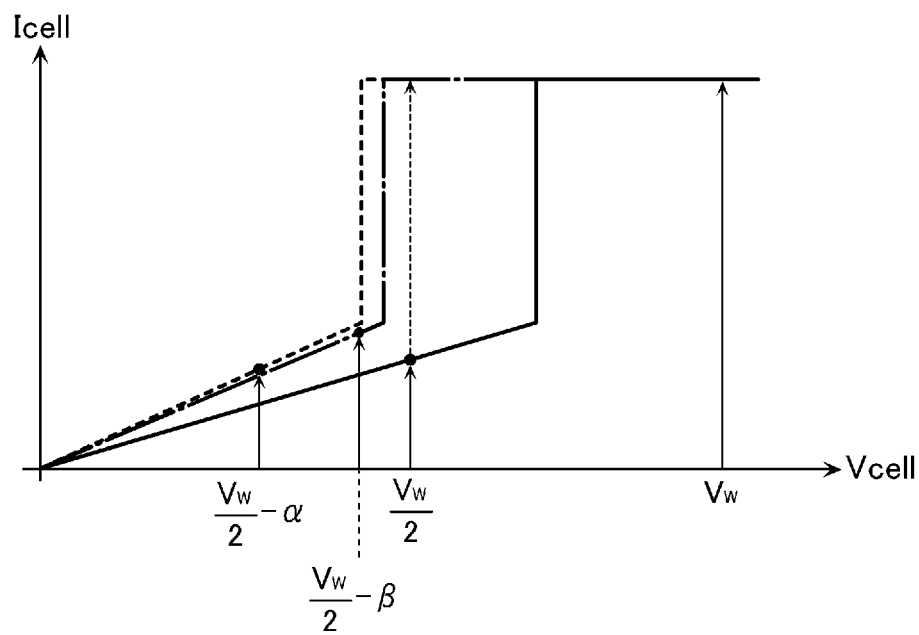
FIG. 18 is a schematic graph illustrating the voltage-current characteristics in a write operation of a memory cell of the same semiconductor storage device.

FIG. 18 is a schematic graph illustrating the voltage-current characteristics in a write operation of the memory cells LMC and UMC of the semiconductor storage device according to the present embodiment. In FIG. 18, the horizontal axis represents a cell voltage Vcell which is a voltage difference between the cathode $E_C$ and the anode $E_A$ of the memory cells LMC and UMC. The vertical axis represents a cell current Icell flowing through the memory cells LMC and UMC on a logarithmic axis. In FIG. 18, a solid line indicates characteristics when the temperature of the memory cells LMC and UMC is lower than a predetermined temperature. A dotted line and a dash-dot line indicate characteristics when the memory cells LMC and UMC are heated and the temperature thereof is equal to or higher than the predetermined temperature. In addition, the characteristics indicated by the dash-dot line are characteristics when the temperature of the memory cells LMC and UMC is lower than the temperature in the characteristics indicated by the dotted line.

[Write Operation in Lower Layer Memory Mat LMM]

First, a state in a write operation for the memory cell LMC in the lower layer memory mat LMM will be described.

In the above-described first embodiment, for example, as illustrated in FIG. 11, when a write operation is performed on the memory cell LMC33 of the lower layer memory mat LMM, a voltage applied to the nonselected memory cells LMC32 and LMC34 adjacent to the selected memory cell LMC33 and arranged at a predetermined interval in the X direction may be set to the voltage (Vw/2)−α smaller than the voltage Vw/2.

In the second embodiment, the voltage applied to the nonselected memory cells LMC31 and LMC35 may be further set to a voltage (Vw/2)−β smaller than the voltage Vw/2 and larger than the voltage (Vw/2)−α (where, β<α).

FIG. 16 illustrates voltages applied to word lines WL0 to WL6, bit lines LBL0 to LBL6, and memory cells LMC00 to LMC66 when a write operation is performed on a selected memory cell LMC33 in the second embodiment. Precisely, the applied voltages correspond to the voltage states from the timing t103 to the timing t104 in FIG. 12.

As illustrated in FIG. 16, in the second embodiment, the voltage Vw may be supplied to the selected word line WL3, the voltage Vw/2 may be supplied to the nonselected word lines WL0, WL1, WL2, WL4, WL5 and WL6, the voltage 0 may be supplied to the selected bit line LBL3, the voltage (Vw/2)+a may be supplied to the nonselected bit lines LBL2 and LBL4 adjacent to the selected bit line LBL3 in the X direction, the voltage (Vw/2)+β may be supplied to the nonselected bit lines LBL1 and LBL5 adjacent to the nonselected bit lines LBL2 and LBL4 in the X direction, and the voltage Vw/2 may be supplied to the nonselected bit lines LBL0 and LBL6. As a result, the voltages applied to the memory cells LMC00 to LMC66 are as illustrated in FIG. 16. The states of the memory cells LMC in relation to these applied voltages may be as indicated in the followings (11) to (14)

(11) The voltage Vw may be applied to the selected memory cell LMC33. Therefore, in the selected memory cell LMC33, a large current may flow in the chalcogen layer 304 (nonlinear element NO), and the phase change region of the chalcogen layer 307 (variable resistance element VR) may be melted or crystallized.

(12) The voltage Vw/2, the voltage 0, the voltage −α or the voltage −β may be applied to the nonselected memory cells other than the nonselected memory cells LMC31, LMC32, LMC34 and LMC35 among the nonselected memory cells. That is, a voltage equal to or lower than the voltage Vw/2 may be applied to the nonselected memory cells other than the memory cells LMC31, LMC32, LMC34 and LMC35 among the nonselected memory cells. Therefore, it is possible that a large current does not flow in the nonselected memory cells other than the memory cells LMC31, LMC32, LMC34 and LMC35 among the nonselected memory cells. Accordingly, it is possible that the states of the nonselected memory cells other than the nonselected memory cells LMC31, LMC32, LMC34 and LMC35 do not change.

(13) A voltage (Vw/2)−α smaller than the voltage Vw/2 may be applied to the nonselected memory cells LMC32 and LMC34 adjacent to the selected memory cell LMC33 at a predetermined interval in the X direction among the nonselected memory cells. In this manner, since the voltage (Vw/2)−α smaller than the voltage Vw/2 is applied to the nonselected memory cells LMC32 and LMC34, it is possible that a large current does not flow in the nonselected memory cells LMC32 and LMC34. Accordingly, it is possible that the states of the nonselected memory cells LMC32 and LMC34 do not change (see the characteristics indicated by the dotted line in FIG. 18).

(14) A voltage (Vw/2)−β smaller than the voltage Vw/2 and larger than the voltage (Vw/2)−α may be applied to the nonselected memory cells LMC31 and LMC35 adjacent to the selected memory cells LMC32 and LMC34 at a predetermined interval in the X direction among the nonselected memory cells. Therefore, it is possible that a large current does not flow in the nonselected memory cells LMC31 and LMC35. Accordingly, it is possible that the states of the nonselected memory cells LMC31 and LMC35 do not change (see the characteristics indicated by the dash-dot line in FIG. 18).

That is, when a current flows in the selected memory cell LMC33 to heat the selected memory cell LMC33, the heat may be transferred to the nonselected memory cells LMC32 and LMC34 and further the nonselected memory cells LMC31 and LMC35 through the barrier insulating layer 324 and the insulating layer 325 extending in the X direction (see FIG. 8). At this time, a distance among the nonselected memory cells LMC31 and LMC35 and the selected memory cell LMC33 may be longer than a distance among the nonselected memory cells LMC32 and LMC34 and the selected memory cell LMC33. Therefore, the temperature of the nonselected memory cells LMC31 and LMC35 can be lower than the temperature of the nonselected memory cells LMC32 and LMC34.

Therefore, the voltage-current characteristics of the nonselected memory cells LMC31 and LMC35 are the characteristics indicated by the dash-dot line in FIG. 18. As a result, by applying the voltage (Vw/2)−β smaller than the voltage Vw/2 and larger than the voltage (Vw/2)−α to the nonselected memory cells LMC31 and LMC35, it is possible that a large current does not flow in the nonselected memory cells LMC31 and LMC35. Accordingly, it is possible that the states of the nonselected memory cells LMC31 and LMC35 do not change.

In addition, the method illustrated in FIG. 16 is merely an example and may be adjusted as appropriate. For example, it is also possible to supply the voltage Vw/2 to the selected word line WL3, a voltage −Vw/2 to the selected bit line LBL3, the voltage 0 to the nonselected word lines WL0 to WL2 and WL4 to WL6 and the nonselected bit lines LBL0 and LBL6, a voltage β to the nonselected bit lines LBL1 and LBL5, and a voltage α to the nonselected bit lines LBL2 and LBL4.

[Write Operation in Upper Layer Memory Mat UMM]

Next, a state in a write operation for the memory cell UMC in the upper layer memory mat UMM will be described.

In the above-described first embodiment, for example, as illustrated in FIG. 13, when a write operation is performed on the memory cell UMC33 of the upper layer memory mat UMM, a voltage applied to the nonselected memory cells UMC23 and UMC43 adjacent to the selected memory cell UMC33 and arranged at a predetermined interval in the Y direction may be set to the voltage (Vw/2)−α smaller than the voltage Vw/2.

In the second embodiment, the voltage applied to the nonselected memory cells UMC13 and UMC53 may be further set to a voltage (Vw/2)−β smaller than the voltage Vw/2 and larger than the voltage (Vw/2)−α (where, β<α).

Figure 17:
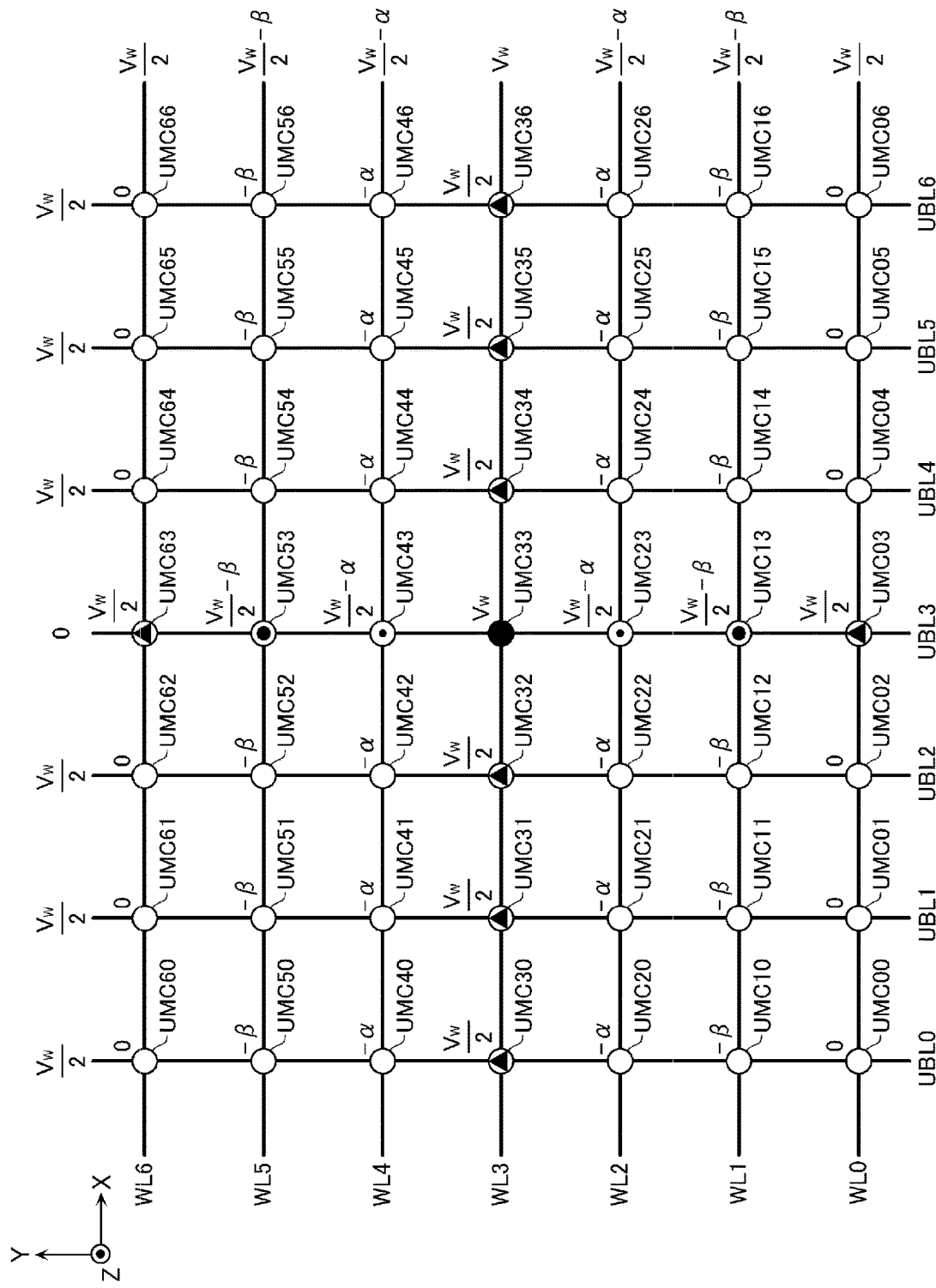
FIG. 17 is a schematic view corresponding to a partial plane of the semiconductor storage device.

FIG. 17 illustrates voltages applied to word lines WL0 to WL6, bit lines UBL0 to UBL6, and memory cells UMC00 to UMC66 when a write operation is performed on a selected memory cell UMC33 in the second embodiment. Exactly, the applied voltages correspond to the voltage states from the timing t203 to the timing t204 in FIG. 14.

As illustrated in FIG. 17, in the second embodiment, the voltage Vw may be supplied to the selected word line WL3, the voltage (Vw/2)−α may be supplied to the nonselected word lines WL2 and WL4 adjacent to the selected word line WL3 in the Y direction, the voltage (Vw/2)−β may be supplied to the nonselected word lines WL1 and WL5 adjacent to the nonselected word lines WL2 and WL4 in the Y direction, the voltage Vw/2 may be supplied to the nonselected word lines WL0 and WL6, the voltage 0 may be supplied to the selected bit line UBL3, and the voltage Vw/2 may be supplied to the nonselected bit lines UBL0, UBL1, UBL2, UBL4, UBL5 and UBL6. As a result, the voltages applied to the memory cells UMC00 to UMC66 are as illustrated in FIG. 17. The states of the memory cells UMC in relation to these applied voltages may be as indicated in the followings (15) to (18).

(15) The voltage Vw may be applied to the selected memory cell UMC33. Therefore, in the selected memory cell UMC33, a large current flows in the chalcogen layer 404 (nonlinear element NO), and the phase change region of the chalcogen layer 407 (variable resistance element VR) may be melted or crystallized.

(16) The voltage Vw/2, the voltage 0, the voltage −α or the voltage −β may be applied to the nonselected memory cells other than the nonselected memory cells UMC13, UMC23, UMC43 and UMC53 among the nonselected memory cells. That is, a voltage equal to or lower than the voltage Vw/2 may be applied to the nonselected memory cells other than the nonselected memory cells UMC13, UMC23, UMC43 and UMC53 among the nonselected memory cells. Therefore, it is possible that a large current does not flow in the nonselected memory cells other than the nonselected memory cells UMC13, UMC23, UMC43 and UMC53 among the nonselected memory cells. Accordingly, it is possible that the states of the nonselected memory cells other than the nonselected memory cells UMC13, UMC23, UMC43 and UMC53 do not change.

(17) A voltage (Vw/2)−α smaller than the voltage Vw/2 may be applied to the nonselected memory cells UMC23 and UMC43 adjacent to the selected memory cell UMC33 at a predetermined interval in the Y direction among the nonselected memory cells. In this manner, since the voltage (Vw/2)−α smaller than the voltage Vw/2 is applied to the nonselected memory cells UMC23 and UMC43, it is possible that a large current does not flow in the nonselected memory cells UMC23 and UMC43. Accordingly, it is possible that the states of the nonselected memory cells UMC23 and UMC43 do not change (see the characteristics indicated by the dotted line in FIG. 18).

(18) A voltage (Vw/2)−β smaller than the voltage Vw/2 and larger than the voltage (Vw/2)−α may be applied to the nonselected memory cells UMC13 and UMC53 adjacent to the nonselected memory cells UMC23 and UMC43 at a predetermined interval in the Y direction among the nonselected memory cells. Therefore, it is possible that a large current does not flow in the nonselected memory cells UMC13 and UMC53. Accordingly, it is possible that the states of the nonselected memory cells UMC13 and UMC53 do not change (see the characteristics indicated by the dash-dot line in FIG. 18).

That is, when a current flows in the selected memory cell UMC33 to heat the selected memory cell UMC33, the heat may be transferred to the nonselected memory cells UMC23 and UMC43 and further to the nonselected memory cells UMC13 and UMC53 through the barrier insulating layer 424 and the insulating layer 425 extending in the Y direction (see FIG. 9). At this time, a distance among the nonselected memory cells UMC13 and UMC53 and the selected memory cell UMC33 may be longer than a distance among the nonselected memory cells UMC23 and UMC43 and the selected memory cell UMC33. Therefore, the temperature of the nonselected memory cells UMC13 and UMC53 may be lower than the temperature of the nonselected memory cells UMC23 and UMC43.

Therefore, the voltage-current characteristics of the nonselected memory cells UMC13 and UMC53 are the characteristics indicated by the dash-dot line in FIG. 18. As a result, by applying the voltage (Vw/2)−β smaller than the voltage Vw/2 and larger than the voltage (Vw/2)−α to the nonselected memory cells UMC13 and UMC53, it is possible that a large current does not flow in the nonselected memory cells UMC13 and UMC53. Accordingly, it is possible that the states of the nonselected memory cells UMC13 and UMC53 do not change.

Further, the method illustrated in FIG. 17 is merely an example and may be adjusted as appropriate. For example, it is also possible to supply the voltage Vw/2 to the selected word line WL3, a voltage −Vw/2 to the selected bit line UBL3, the voltage 0 to the nonselected word lines WL0 and WL6 and the nonselected bit lines UBL0 to UBL2 and UBL4 to UBL6, a voltage −β to the nonselected word lines WL1 and WL5, and a voltage −α to the nonselected word lines WL2 and WL4.

[Manufacturing Method]

Next, a method for manufacturing a semiconductor storage device according to the present embodiment will be described with reference to FIGS. 19 to 35. FIGS. 19 to 22 and 32 to 35 are schematic sectional views corresponding to FIG. 5. FIGS. 23 to 31 are schematic sectional views corresponding to FIG. 6. For convenience of explanation, certain configurations may be omitted in FIGS. 19 to 35.

In manufacturing the semiconductor storage device according to the present embodiment, for example, the peripheral circuit PC may be formed on a semiconductor wafer. Next, for example, the wiring layer 200 (FIG. 5) or the like for connecting the peripheral circuit PC to a memory cell array MCA may be formed.

Figure 19:
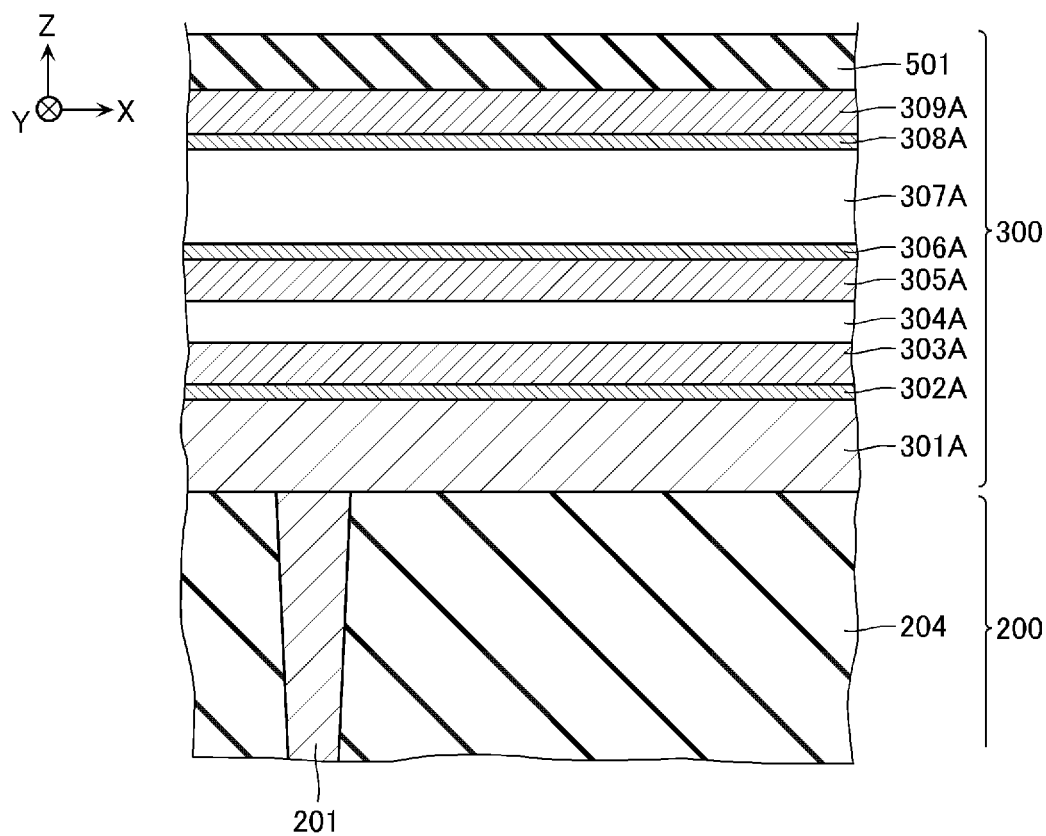
FIG. 19 is a schematic view illustrating a method of manufacturing a semiconductor storage device according to an embodiment.

Next, for example, as illustrated in FIG. 19, on the upper surface of the insulating layer 204 may be formed a stacked body including a conductive layer 301A that forms the conductive layer 301, a barrier conductive layer 302A that forms the barrier conductive layer 302, an electrode layer 303A that forms the electrode layer 303, a chalcogen layer 304A that forms the chalcogen layer 304, an electrode layer 305A that forms the electrode layer 305, a barrier conductive layer 306A that forms the barrier conductive layer 306, a chalcogen layer 307A (variable resistance layer) that forms the chalcogen layer 307, a barrier conductive layer 308A that forms the barrier conductive layer 308, an electrode layer 309A that forms the electrode layer 309, and a hard mask layer 501 such as silicon nitride (SiN). This step may be performed by, for example, PVD (Physical Vapor Deposition) such as sputtering.

Figure 20:
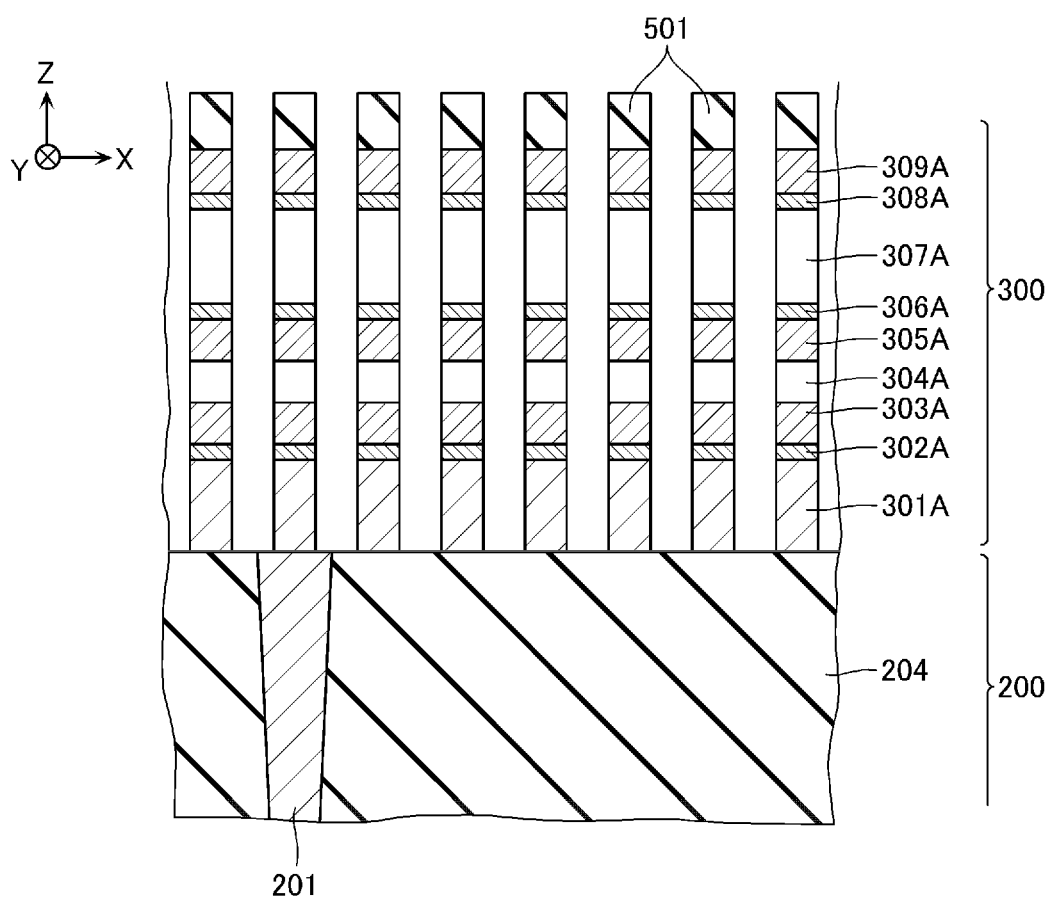
FIG. 20 is a schematic view illustrating the manufacturing method.

Next, for example, as illustrated in FIG. 20, a step of dividing the above-described stacked body in the X direction may be performed. Through this step, the hard mask layer 501 may be partially removed and divided in the X direction to form a line and space pattern.

Further, according to this step, the conductive layer 301A, the barrier conductive layer 302A, the electrode layer 303A, the chalcogen layer 304A, the electrode layer 305A, the barrier conductive layer 306A, the chalcogen layer 307A, the barrier conductive layer 308A and the electrode layer 309A may be divided in the X direction along the pattern formed in the hard mask layer 501. This step may be performed by, for example, anisotropic etching such as RIE.

Figure 21:
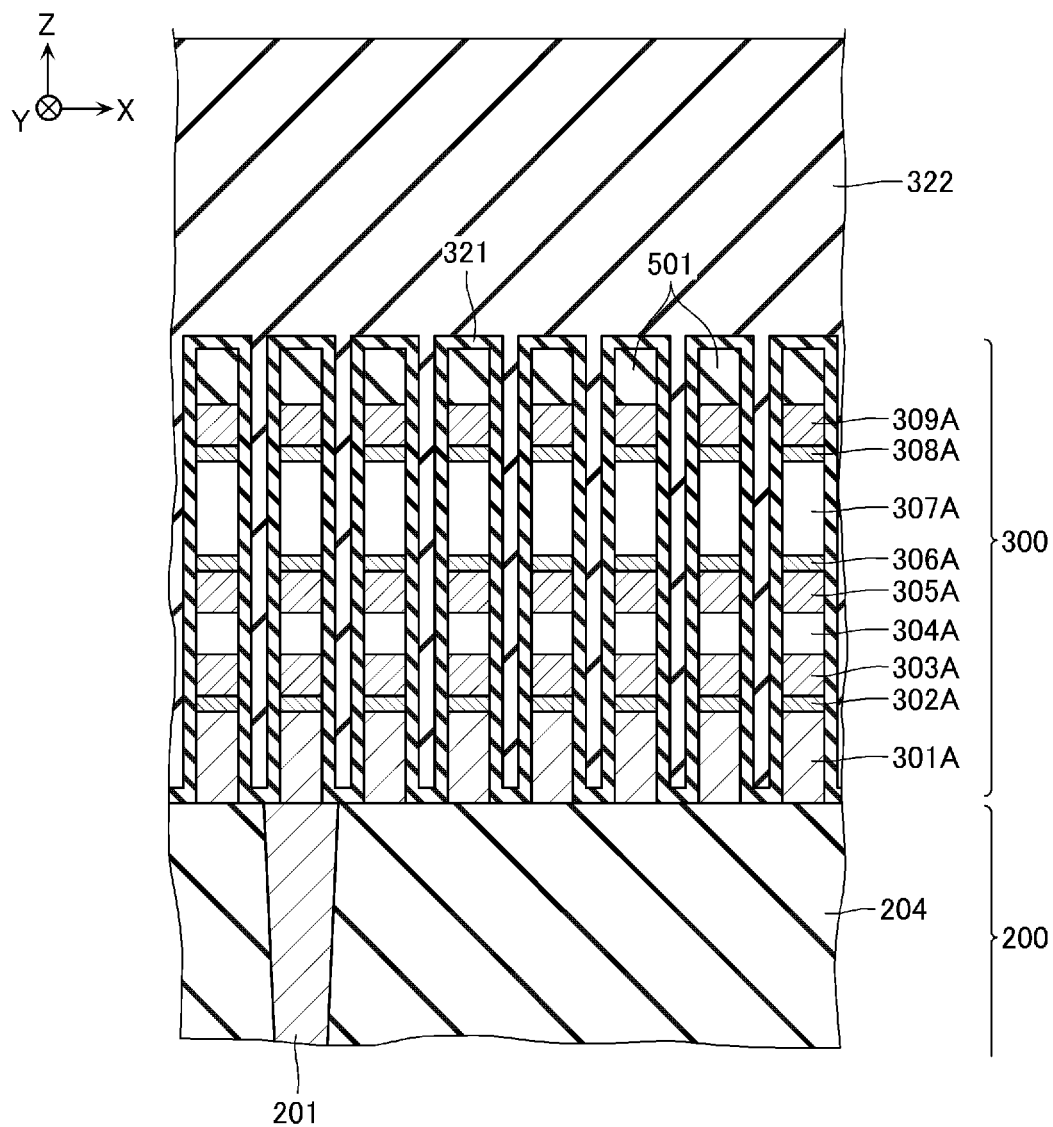
FIG. 21 is a schematic view illustrating the manufacturing method.

Next, for example, as illustrated in FIG. 21, a barrier insulating layer 321 may be formed on the upper surface of the insulating layer 204, the upper surface of the hard mask layer 501, and the side surfaces of the conductive layer 301A, the barrier conductive layer 302A, the electrode layer 303A, the chalcogen layer 304A, the electrode layer 305A, the barrier conductive layer 306A, the chalcogen layer 307A, the barrier conductive layer 308A and the electrode layer 309A in the X direction. In addition, an insulating layer 322 may be formed. The insulating layer 322 may be formed, for example, by applying polysilazane or the like on the wafer by a method such as spin coating and performing heat treatment or the like.

Figure 22:
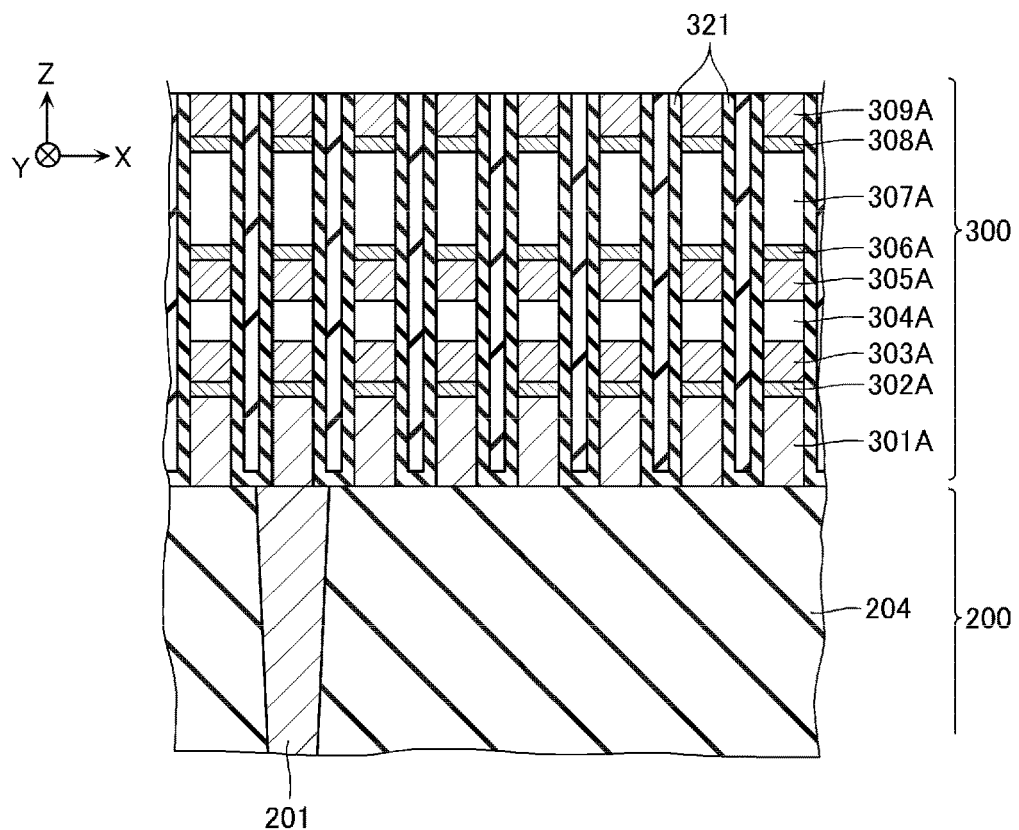
FIG. 22 is a schematic view illustrating the manufacturing method.
Figure 23:
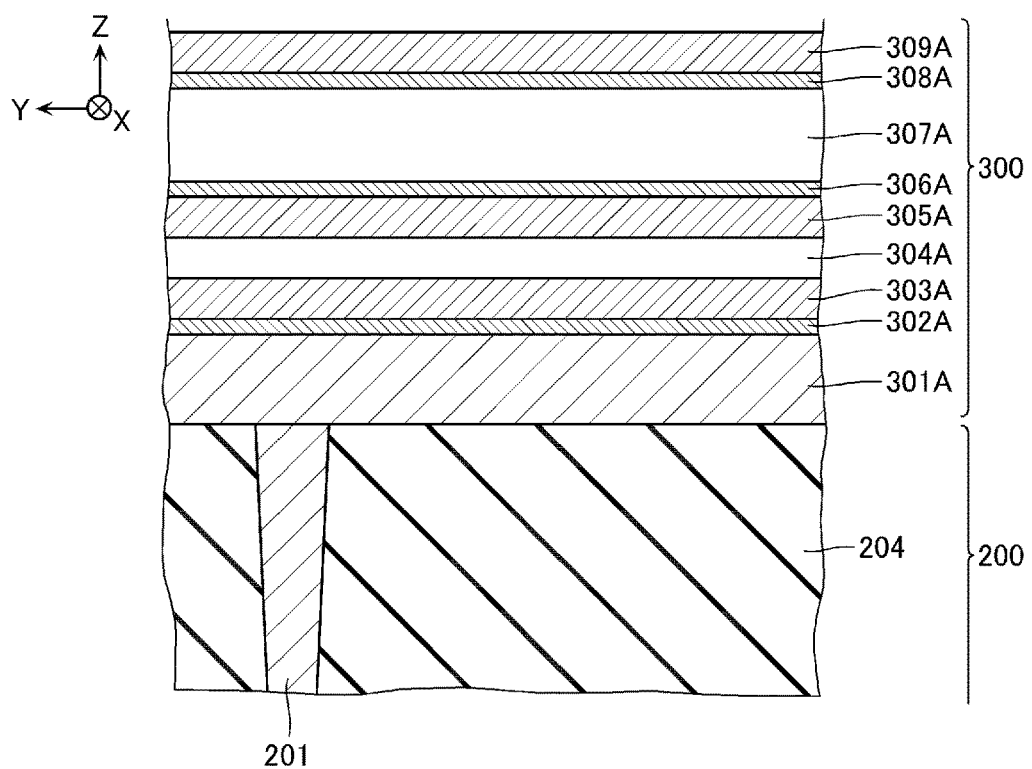
FIG. 23 is a schematic view illustrating the manufacturing method.

Next, for example, as illustrated in FIGS. 22 and 23, the hard mask layer 501 may be partially removed to expose the upper surface of the electrode layer 309A. This step may be performed, for example, by CMP (Chemical Mechanical Polishing).

Figure 24:
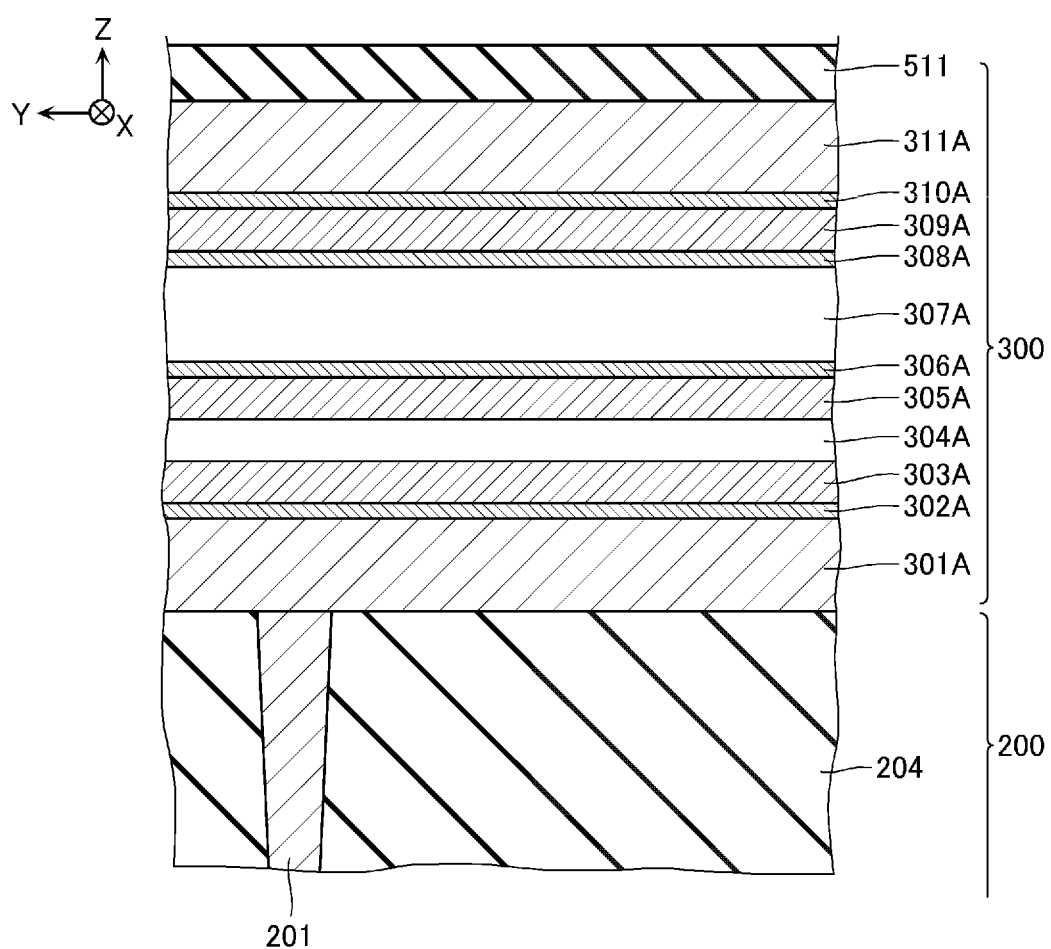
FIG. 24 is a schematic view illustrating the manufacturing method.

Next, for example, as illustrated in FIG. 24, on the upper surface of the electrode layer 309A may be formed a stacked body including a barrier conductive layer 310A that forms the barrier conductive layer 310, a conductive layer 311A that forms the conductive layer 311, and a hard mask layer 511 such as silicon nitride (SiN). This step may be performed, for example, by PVD such as sputtering.

Figure 25:
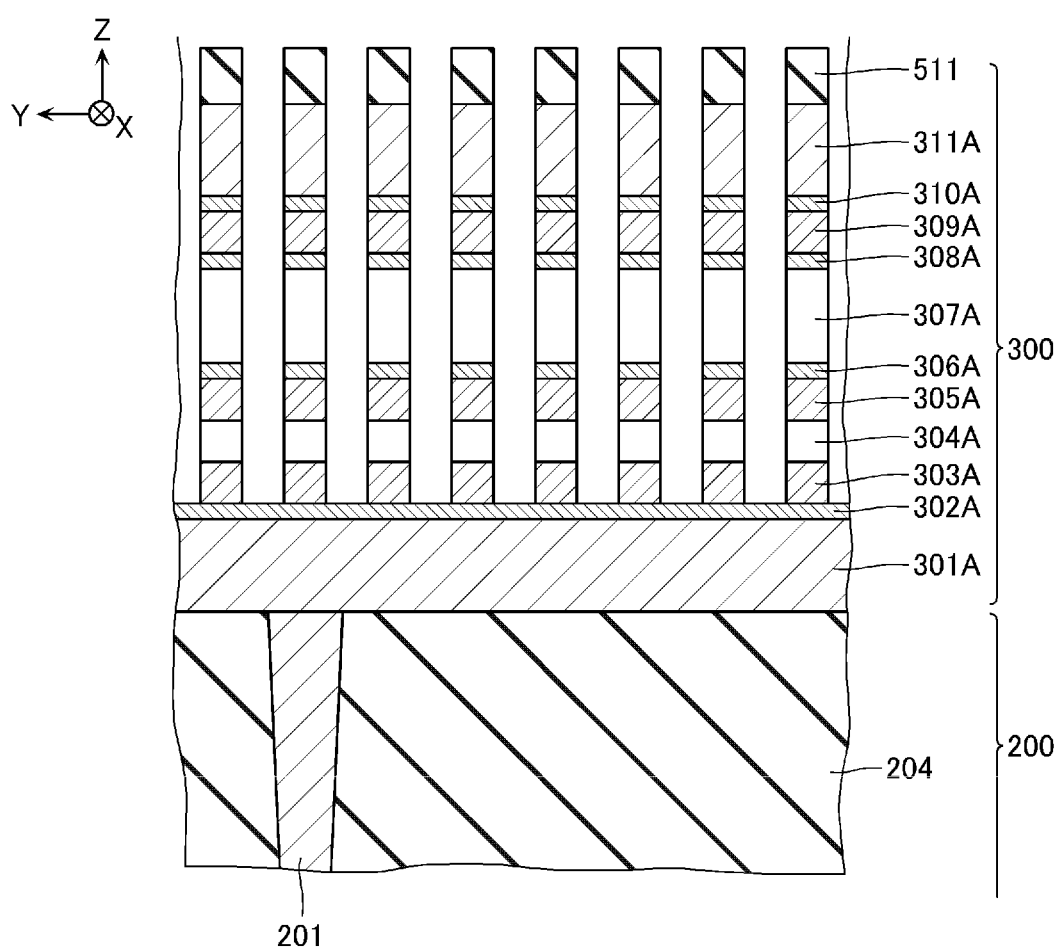
FIG. 25 is a schematic view illustrating the manufacturing method.

Next, for example, as illustrated in FIG. 25, a step of dividing the above-described stacked body in the Y direction may be performed. Through this step, the hard mask layer 511 may be divided in the Y direction to form a line and space pattern.

Further, through this step, the electrode layer 303A, the chalcogen layer 304A, the electrode layer 305A, the barrier conductive layer 306A, the chalcogen layer 307A, the barrier conductive layer 308A, the electrode layer 309A, the barrier conductive layer 310A and the conductive layer 311A may be divided in the Y direction along the pattern formed in the hard mask layer 511. This step may be performed by, for example, anisotropic etching such as RIE.

Figure 26:
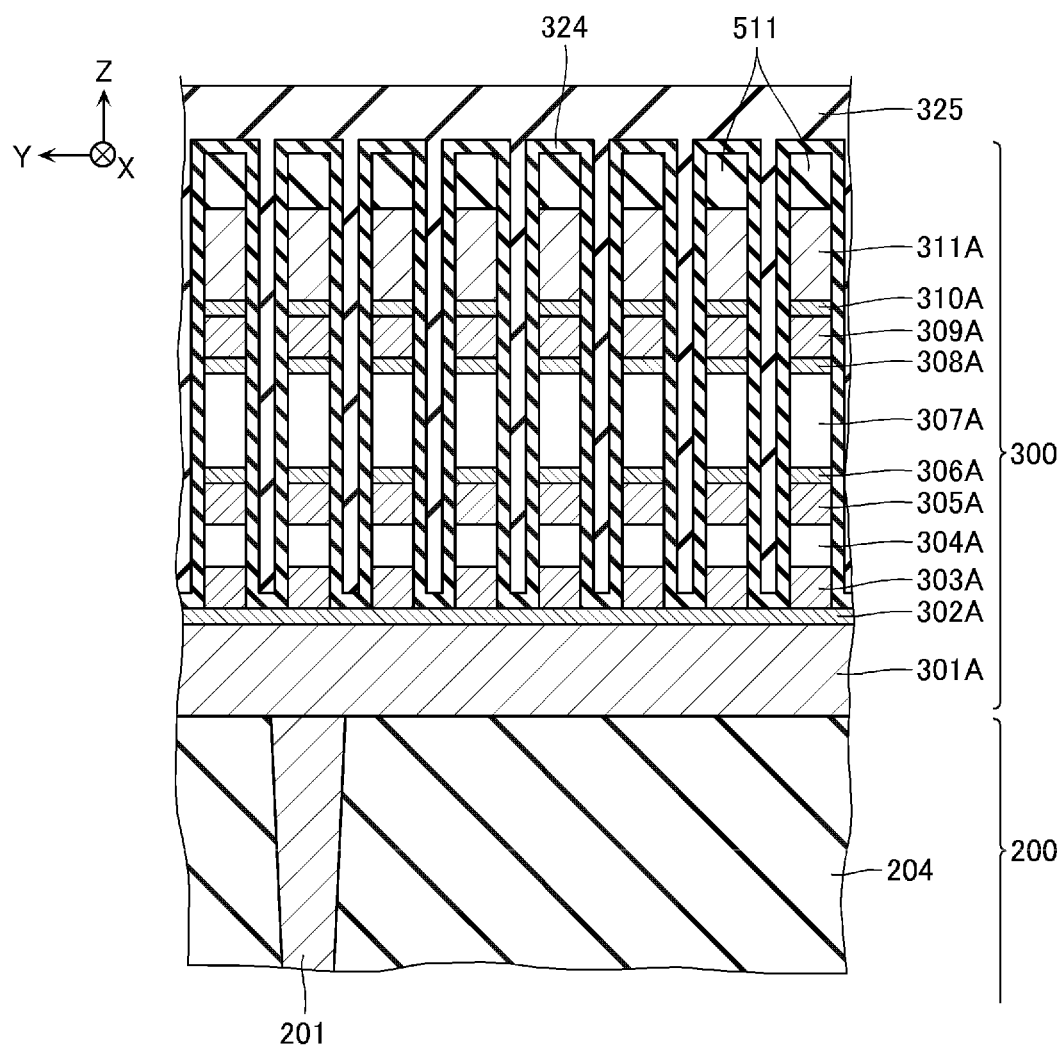
FIG. 26 is a schematic view illustrating the manufacturing method.

Next, for example, as illustrated in FIG. 26, a barrier insulating layer 324 may be formed on the upper surfaces of the barrier conductive layer 302A and the insulating layer 323, the upper surface of the hard mask layer 511, and the side surfaces of the electrode layer 303A, the chalcogen layer 304A, the electrode layer 305A, the barrier conductive layer 306A, the chalcogen layer 307A, the barrier conductive layer 308A, the electrode layer 309A, the barrier conductive layer 310A, the conductive layer 311A and the hard mask layer 511 in the Y direction. In addition, an insulating layer 325 may be formed. The insulating layer 325 may be formed, for example, by applying polysilazane or the like on the wafer by a method such as spin coating and performing heat treatment or the like.

As may be seen from FIG. 26, the barrier insulating layer 324 and the insulating layer 325 may extend in the X direction (see FIG. 8).

Next, the insulating layer 325 may be partially removed to expose the upper surface of the hard mask layer 511. This step may be performed, for example, by a planarization process such as CMP using the hard mask layer 511 as a stopper.

Figure 27:
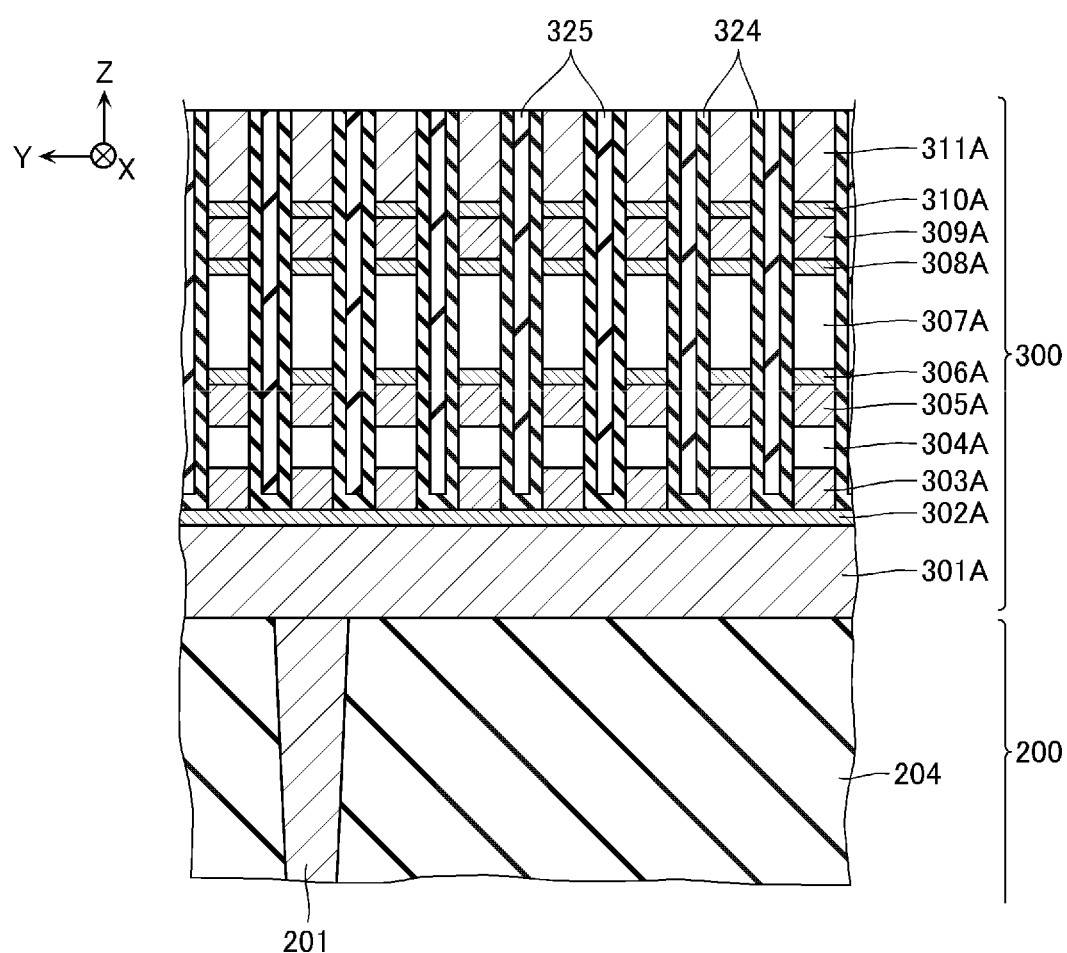
FIG. 27 is a schematic view illustrating the manufacturing method.

Next, for example, as illustrated in FIG. 27, the hard mask layer 511 may be partially removed to expose the upper surface of the conductive layer 311A. This step may be performed, for example, by CMP or wet etching.

Figure 28:
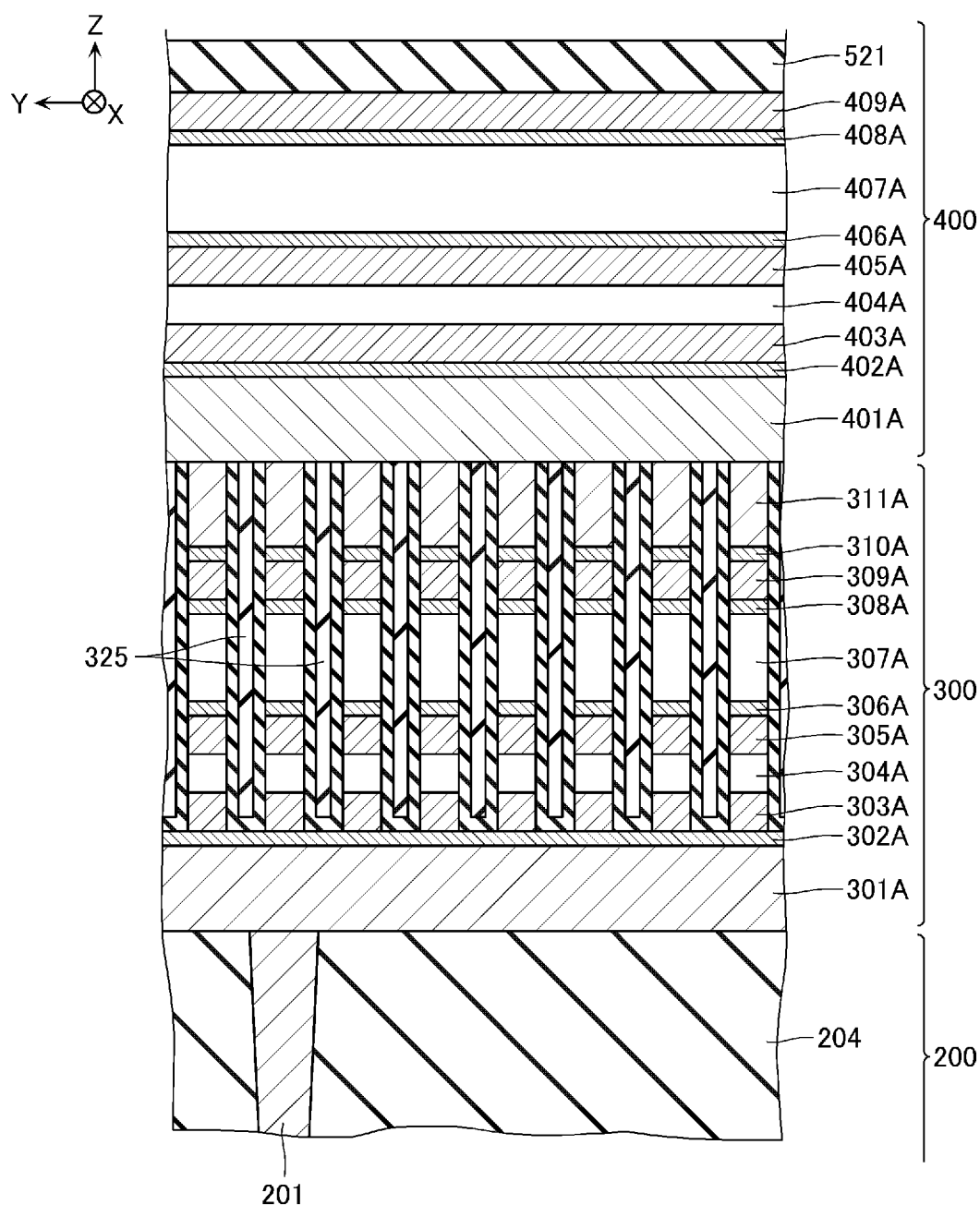
FIG. 28 is a schematic view illustrating the manufacturing method.

Next, for example, as illustrated in FIG. 28, on the upper surfaces of the conductive layer 311A and the insulating layer 325 may be formed a stacked body including a conductive layer 401A that forms the conductive layer 401, a barrier conductive layer 402A that forms the barrier conductive layer 402, an electrode layer 403A that forms the electrode layer 403, a chalcogen layer 404A that forms the chalcogen layer 404, an electrode layer 405A that forms the electrode layer 405, a barrier conductive layer 406A that forms the barrier conductive layer 406, a chalcogen layer 407A (variable resistance layer) that forms the chalcogen layer 407, a barrier conductive layer 408A that forms the barrier conductive layer 408, an electrode layer 409A that forms the electrode layer 409, and a hard mask layer 521 such as silicon nitride (SiN). This step may be performed, for example, by PVD such as sputtering.

Figure 29:
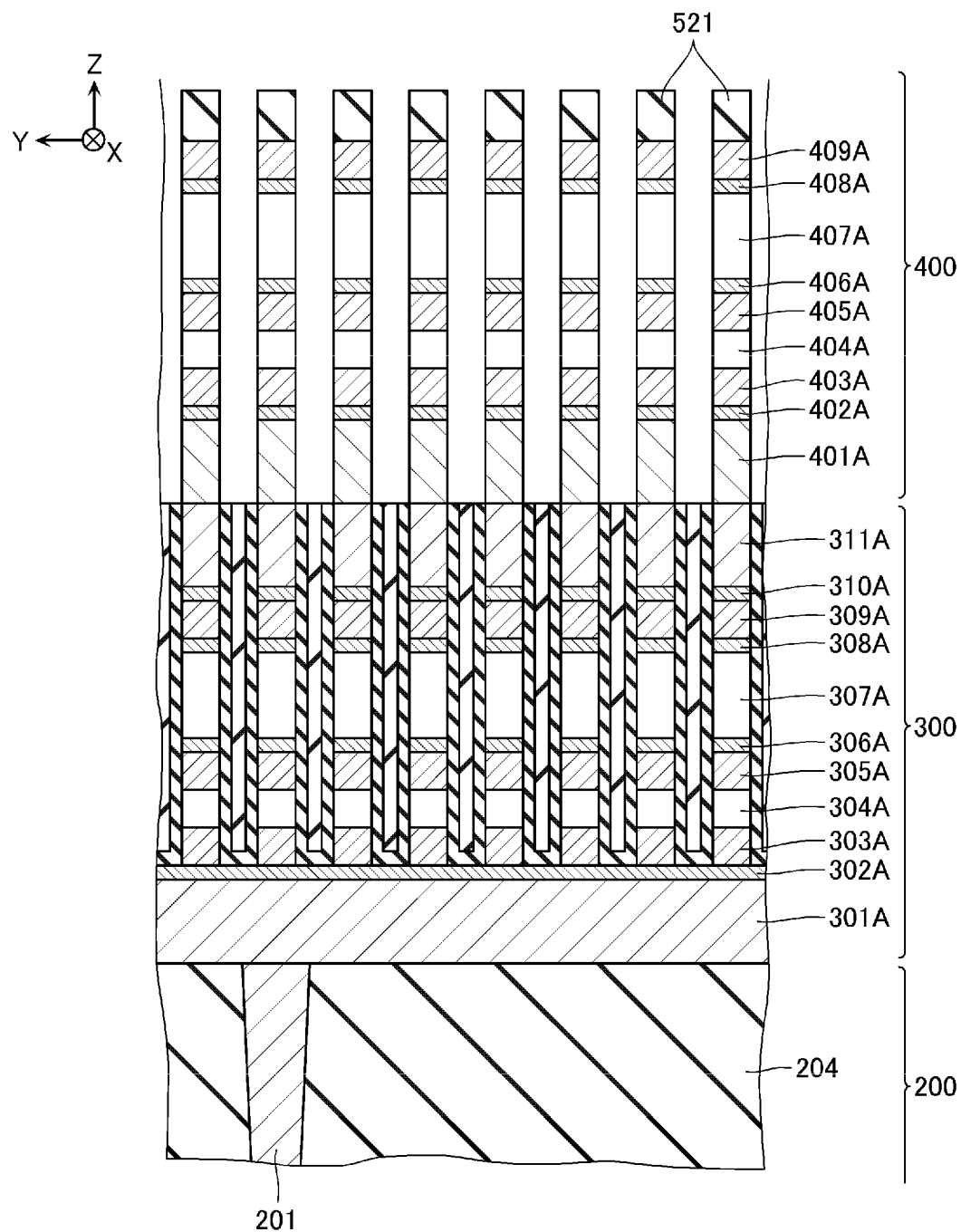
FIG. 29 is a schematic view illustrating the manufacturing method.

Next, for example, as illustrated in FIG. 29, a step of dividing the above-described stacked body in the Y direction may be performed. Through this step, the hard mask layer 521 may be divided in the Y direction to form a line and space pattern.

Further, according to this step, the conductive layer 401A, the barrier conductive layer 402A, the electrode layer 403A, the chalcogen layer 404A, the electrode layer 405A, the barrier conductive layer 406A, the chalcogen layer 407A, the barrier conductive layer 408A and the electrode layer 409A may be divided in the Y direction along the pattern formed in the hard mask layer 521. This step may be performed by, for example, anisotropic etching such as RIE.

Figure 30:
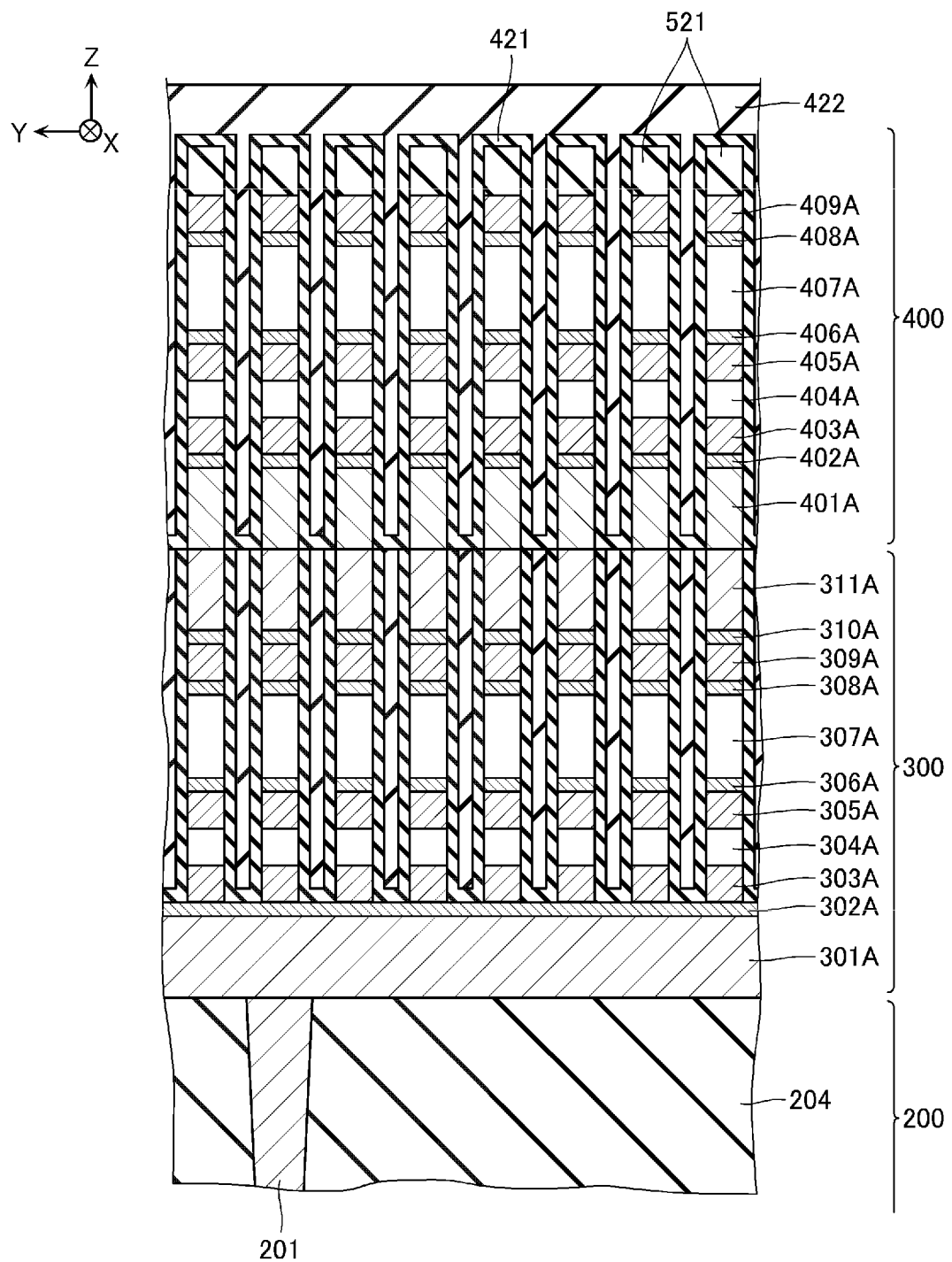
FIG. 30 is a schematic view illustrating the manufacturing method.

Next, for example, as illustrated in FIG. 30, a barrier insulating layer 421 may be formed on the upper surface of the hard mask layer 521, and the side surfaces of the conductive layer 401A, the barrier conductive layer 402A, the electrode layer 403A, the chalcogen layer 404A, the electrode layer 405A, the barrier conductive layer 406A, the chalcogen layer 407A, the barrier conductive layer 408A, the electrode layer 409A and the hard mask layer 521 in the Y direction. In addition, an insulating layer 422 may be formed. The insulating layer 422 may be formed, for example, by applying polysilazane or the like on the wafer by a method such as spin coating and performing heat treatment or the like.

Next, the insulating layer 422 may be partially removed to expose the upper surface of the hard mask layer 521. This step may be performed by, for example, a planarization process such as CMP using the hard mask layer 521 as a stopper.

Figure 31:
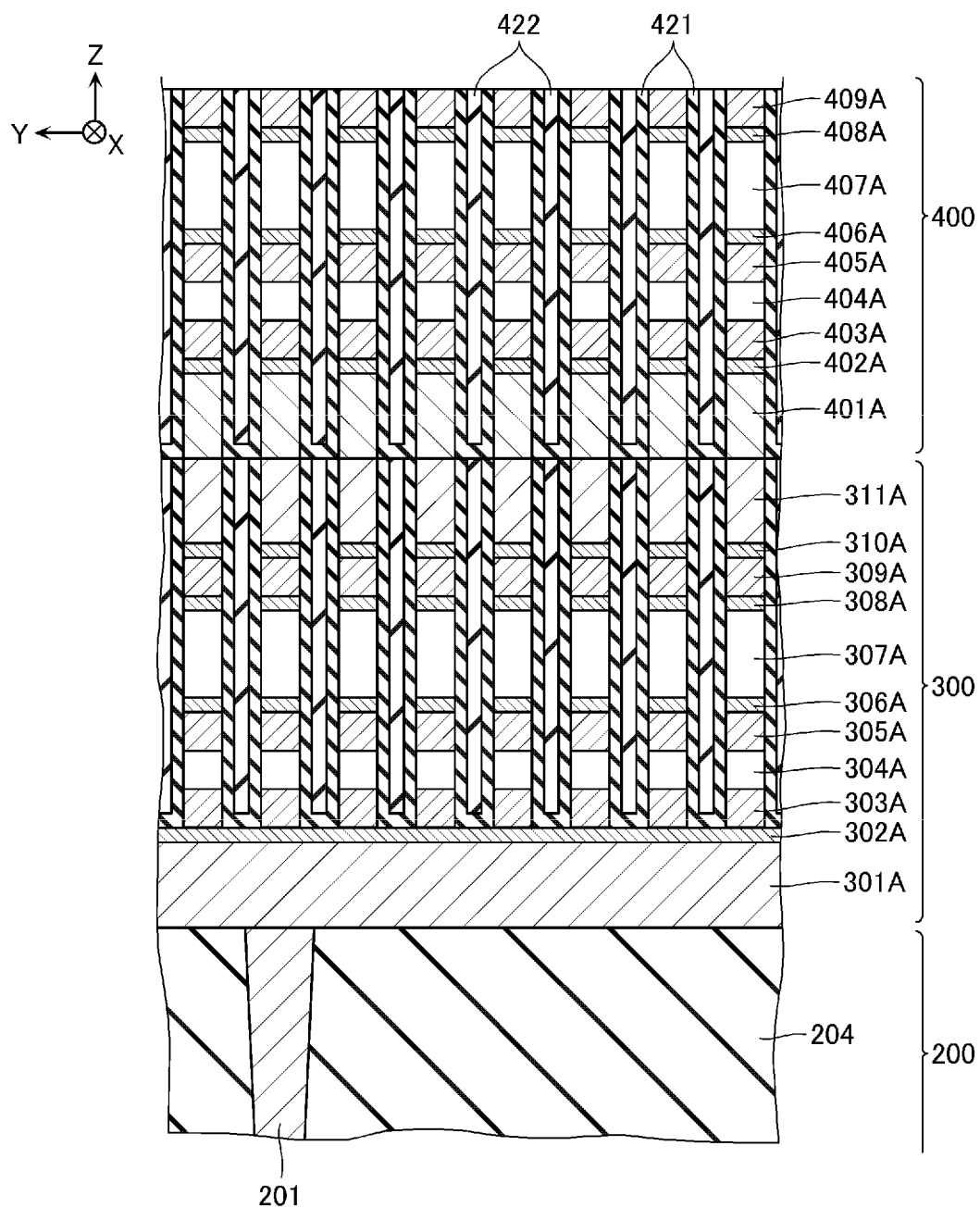
FIG. 31 is a schematic view illustrating the manufacturing method.
Figure 32:
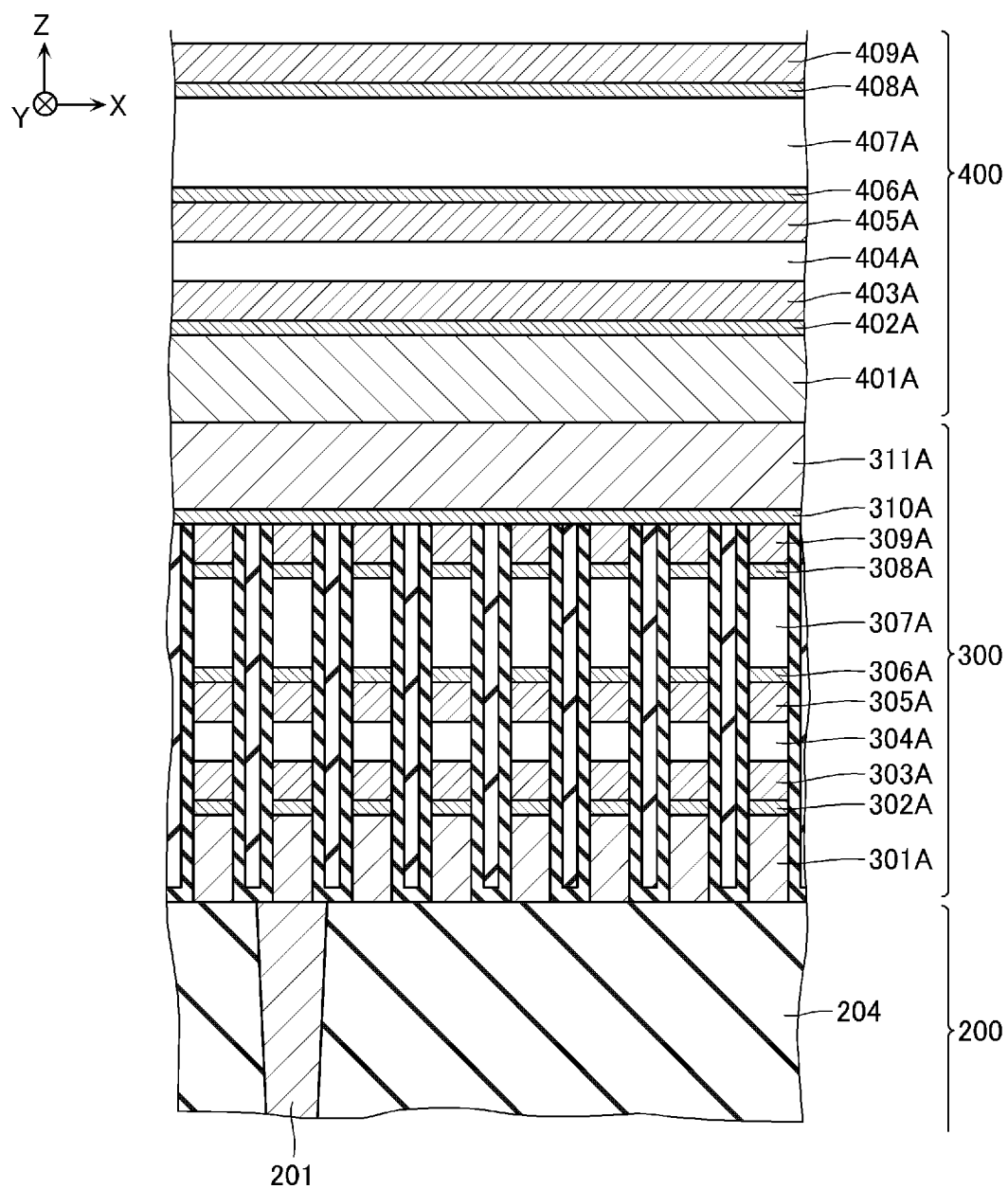
FIG. 32 is a schematic view illustrating the manufacturing method.

Next, for example, as illustrated in FIGS. 31 and 32, the hard mask layer 521 may be partially removed to expose the upper surface of the electrode layer 409A. This step may be performed, for example, by CMP or wet etching.

Figure 33:
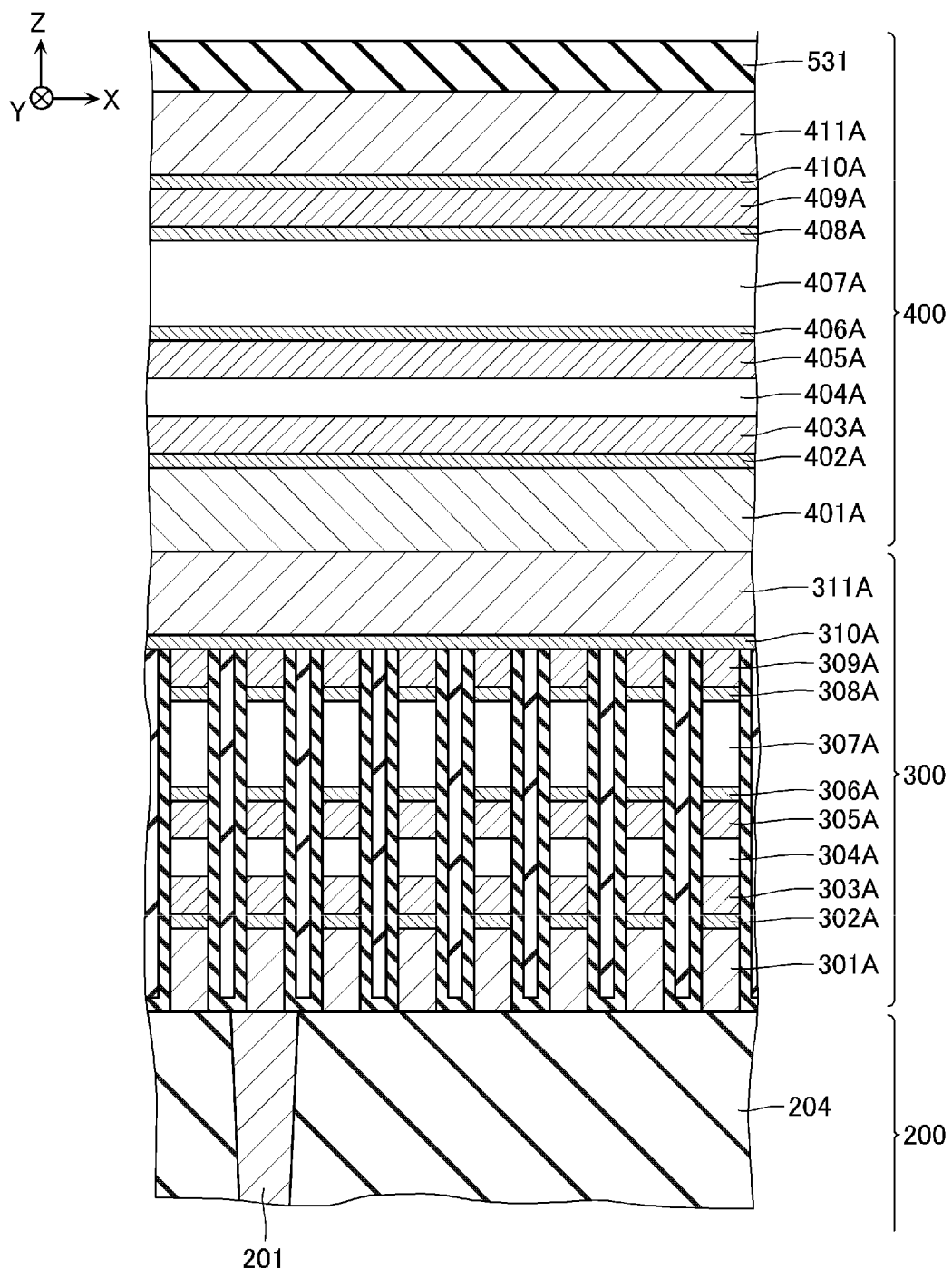
FIG. 33 is a schematic view illustrating the manufacturing method.

Next, for example, as illustrated in FIG. 33, on the upper surfaces of the electrode layer 409A and the insulating layer 422 may be formed a stacked body including a barrier conductive layer 410A that forms the barrier conductive layer 410, a conductive layer 411A that forms the conductive layer 411, and a hard mask layer 531 such as silicon nitride (SiN). This step is performed, for example, by PVD such as sputtering.

Figure 34:
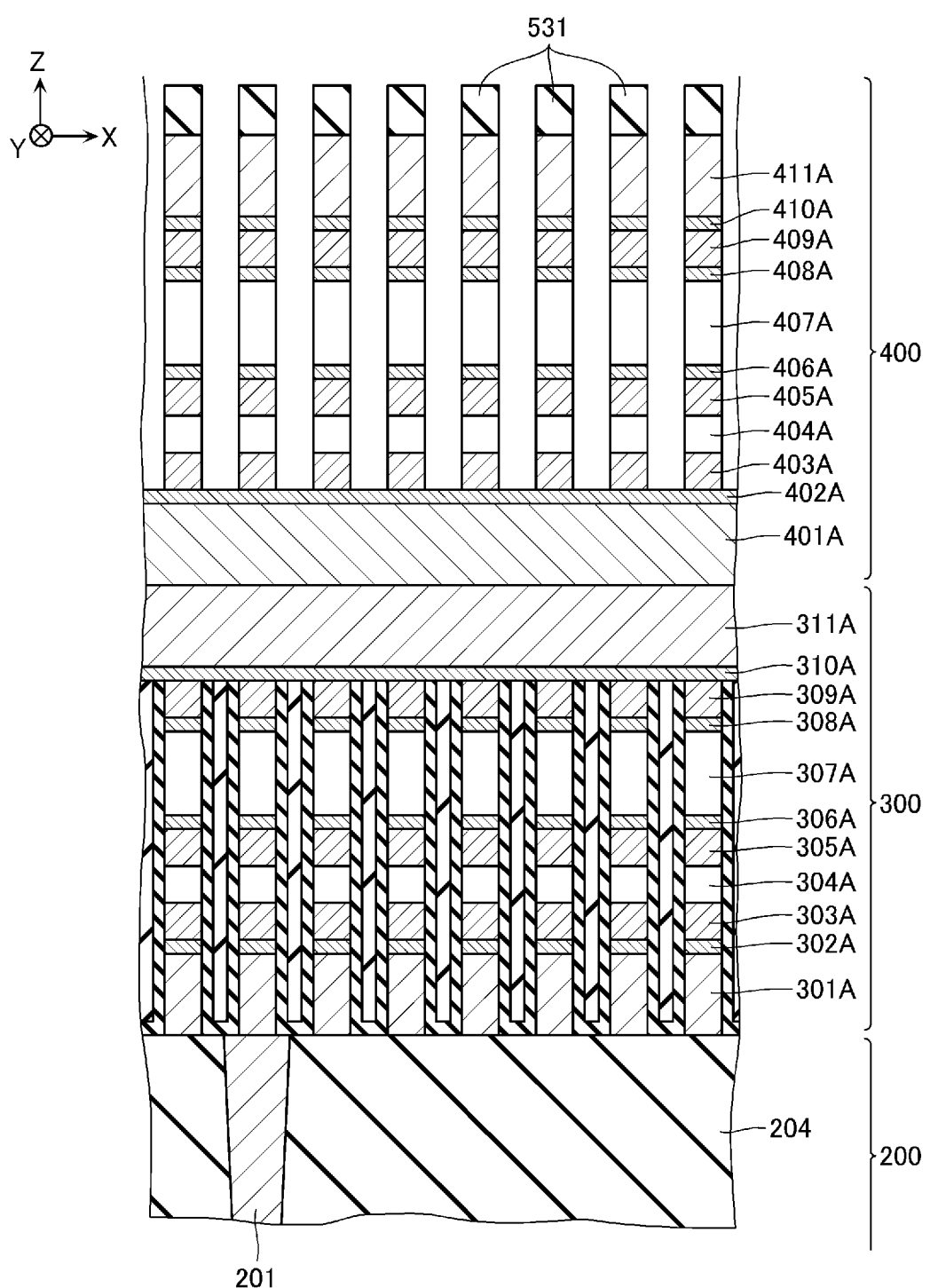
FIG. 34 is a schematic view illustrating the manufacturing method.

Next, for example, as illustrated in FIG. 34, a step of dividing the above-described stacked body in the X direction may be performed. Through this step, the hard mask layer 531 may be divided in the X direction to form a line and space pattern.

Further, according to this step, the electrode layer 403A, the chalcogen layer 404A, the electrode layer 405A, the barrier conductive layer 406A, the chalcogen layer 407A, the barrier conductive layer 408A, the electrode layer 409A, the barrier conductive layer 410A and the conductive layer 411A may be divided in the X direction and the Y direction along the pattern formed in the hard mask layer 531. This step may be performed by, for example, anisotropic etching such as RIE.

Figure 35:
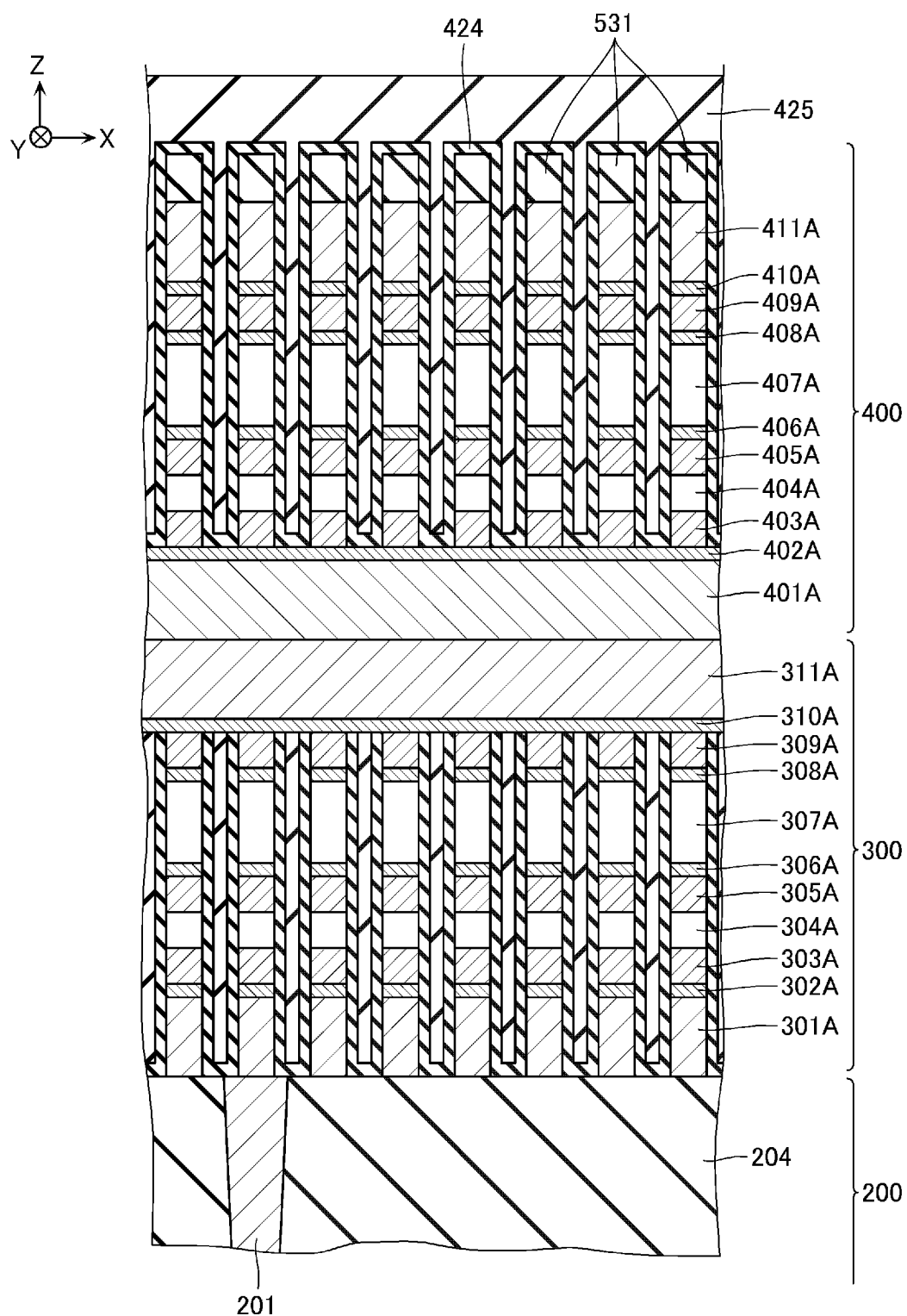
FIG. 35 is a schematic view illustrating the manufacturing method.

Next, for example, as illustrated in FIG. 35, a barrier insulating layer 424 may be formed on the upper surface of the barrier conductive layer 402A, the upper surface of the hard mask layer 531, and the side surfaces of the electrode layer 403A, the chalcogen layer 404A, the electrode layer 405A, the barrier conductive layer 406A, the chalcogen layer 407A, the barrier conductive layer 408A, the electrode layer 409A, the barrier conductive layer 410A, the conductive layer 411A and the hard mask layer 531 in the Y direction. In addition, an insulating layer 425 may be formed. The insulating layer 425 may be formed, for example, by applying polysilazane or the like on the wafer by a method such as spin coating and performing heat treatment or the like.

As may be seen from FIG. 35, the barrier insulating layer 424 and the insulating layer 425 may extend in the Y direction (see FIG. 9).

[Setting of Voltage $\alpha$]

The magnitude of the voltage $\alpha$ may be set by various methods. For example, in the example of FIG. 11, as the voltage $\alpha$ becomes larger, a voltage applied to the nonselected memory cells LMC32 and LMC34 may become smaller, thereby preventing a state change in the nonselected memory cells LMC32 and LMC34. Meanwhile, when the voltage $\alpha$ is excessively increased, a voltage applied to the other nonselected memory cells LMC12, LMC22, LMC42, LMC52, LMC14, LMC24, LMC44 and LMC54 connected to the nonselected bit lines LBL2 and LBL4 may increase, which may cause a state change in these nonselected memory cells. Accordingly, it is desirable to adjust the voltage a to a suitable magnitude as appropriate.

To this end, for example, all the memory cells MC in the lower layer memory mat LMM may be put in a set or reset state. Then, a predetermined lower layer bit line LBL may be selected and a set or reset operation is performed. Then, a read operation may be sequentially performed to count the number of error bits. Then, the above operation may be repeated while changing the voltage $\alpha$. Then, the voltage $\alpha$ when the number of error bits is minimized may be acquired and stored in the ROM area in the memory cell array MCA. The same method may be applied to acquire the voltage a for the upper layer memory mat UMM. The voltage $\alpha$ may be a common value or a different value between the lower layer memory mat LMM and the upper layer memory mat UMM.

While certain embodiments have been described, these embodiments have been presented byway of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device comprising:
   a control circuit;
   a first wiring extending in a first direction;
   a second wiring and a third wiring, each extending in the first direction and being adjacent to the first wiring in a second direction intersecting the first direction;
   a fourth wiring extending in the second direction;
   a fifth wiring and a sixth wiring, each extending in the second direction and being adjacent to the fourth wiring in the first direction;
   a plurality of memory cells each having one end connected to one of the first to third wirings and the other end connected to one of the fourth to sixth wirings;
   a voltage output circuit configured to output a first voltage, a second voltage higher than the first voltage, a third voltage higher than the first voltage, a fourth voltage higher than the second voltage and the third voltage, and a fifth voltage higher than the fourth voltage; and a voltage transfer circuit connected to the first to sixth wirings and the voltage output circuit, wherein, at a predetermined timing of a write operation for memory cells connected to the first wiring and the fourth wiring, the control circuit is configured to:

transfer the first voltage to the first wiring;
transfer the fourth voltage to the second wiring;
transfer the second voltage to the third wiring;
transfer the fifth voltage to the fourth wiring;
transfer the third voltage to the fifth wiring; and
transfer the third voltage to the sixth wiring.

2. The semiconductor storage device according to claim 1, wherein each of the memory cells includes a variable resistance film and a chalcogen film.

3. The semiconductor storage device according to claim 1, wherein the fourth to sixth wirings are farther from a substrate than the first to third wirings.

4. The semiconductor storage device according to claim 1, wherein magnitudes of the second voltage and the third voltage match or substantially match each other.

5. The semiconductor storage device according to claim 1, wherein
the plurality of memory cells include:
first to third memory cells connected to the fourth wiring;
fourth to sixth memory cells connected to the fifth wiring; and
seventh to ninth memory cells connected to the sixth wiring, and
the semiconductor storage device further comprises:
a first insulating film formed on side surfaces of the first to third memory cells in the first direction and extending in the second direction;
a second insulating film formed on side surfaces of the fourth to sixth memory cells in the first direction and extending in the second direction; and
a third insulating film formed on side surfaces of the seventh to ninth memory cells in the first direction and extending in the second direction.

6. A semiconductor storage device comprising:
a control circuit;
a first wiring extending in a first direction;
a second wiring and a third wiring, each extending in the first direction and being adjacent to the first wiring in a second direction intersecting the first direction;
a fourth wiring extending in the second direction;
a fifth wiring and a sixth wiring, each extending in the second direction and being adjacent to the fourth wiring in the first direction;
a plurality of memory cells each having one end connected to one of the first to third wirings and the other end connected to one of the fourth to sixth wirings;
a voltage output circuit configured to output a first voltage, a second voltage lower than the first voltage, a third voltage lower than the first voltage, a fourth voltage lower than the second voltage and the third voltage, and a fifth voltage lower than the fourth voltage; and
a voltage transfer circuit connected to the first to sixth wirings and the voltage output circuit,
wherein, at a predetermined timing of a write operation for memory cells connected to the first wiring and the fourth wiring, the control circuit is configured to:
transfer the first voltage to the first wiring;
transfer the fourth voltage to the second wiring;
transfer the second voltage to the third wiring;
transfer the fifth voltage to the fourth wiring;
transfer the third voltage to the fifth wiring; and
transfer the third voltage to the sixth wiring.

7. The semiconductor storage device according to claim 6, wherein each of the memory cells includes a variable resistance film and a chalcogen film.

8. The semiconductor storage device according to claim 7, wherein the fourth to sixth wirings are farther from a substrate than the first to third wirings.

9. The semiconductor storage device according to claim 6, wherein magnitudes of the second voltage and the third voltage match or substantially match each other.

10. The semiconductor storage device according to claim 6, wherein
the plurality of memory cells include:
first to third memory cells connected to the fourth wiring;
fourth to sixth memory cells connected to the fifth wiring; and
seventh to ninth memory cells connected to the sixth wiring,
the semiconductor storage device further comprises:
a first insulating film formed on side surfaces of the first to third memory cells in the first direction and extending in the second direction;
a second insulating film formed on side surfaces of the fourth to sixth memory cells in the first direction and extending in the second direction; and
a third insulating film formed on side surfaces of the seventh to ninth memory cells in the first direction and extending in the second direction.

* * * * *